United States Patent
Nachefski et al.

(10) Patent No.: US 10,251,316 B1
(45) Date of Patent: Apr. 2, 2019

(54) AIR CONDITIONER MISTER, APPARATUS AND METHOD

(71) Applicant: Mistbox, Inc., Houston, TX (US)

(72) Inventors: William S. Nachefski, Katy, TX (US); Joshua Allen Teekell, Houston, TX (US)

(73) Assignee: Mistbox, Inc., Houston, TX (US)

( * ) Notice: Subject to any disclaimer, the term of this patent is extended or adjusted under 35 U.S.C. 154(b) by 263 days.

(21) Appl. No.: 14/851,146

(22) Filed: Sep. 11, 2015

Related U.S. Application Data

(63) Continuation-in-part of application No. 14/495,466, filed on Sep. 24, 2014, now Pat. No. 9,134,039, which is a continuation of application No. 13/482,815, filed on May 29, 2012, now Pat. No. 9,198,980.

(60) Provisional application No. 62/174,045, filed on Jun. 11, 2015.

(51) Int. Cl.
    *F24F 11/00* (2018.01)
    *B01F 3/04* (2006.01)
    *F28D 5/00* (2006.01)
    *G05B 15/00* (2006.01)
    *H05K 7/20* (2006.01)
    *F17D 3/01* (2006.01)

(52) U.S. Cl.
    CPC ........... *H05K 7/20763* (2013.01); *B01F 3/04* (2013.01); *F17D 3/01* (2013.01); *F24F 11/00* (2013.01); *F28D 5/00* (2013.01); *G05B 15/00* (2013.01)

(58) Field of Classification Search
    CPC .. F24F 11/00; G05B 15/00; B01F 3/04; F28D 5/00; F28D 3/00
    USPC ...................................... 261/26; 62/305, 121
    See application file for complete search history.

(56) References Cited

U.S. PATENT DOCUMENTS

| | | | |
|---|---|---|---|
| 2,004,147 A | 6/1935 | Worrall | |
| 5,065,037 A | 11/1991 | Finney et al. | |
| 5,071,160 A | 12/1991 | White et al. | |
| 5,143,655 A | 9/1992 | Chiu et al. | |
| 5,161,820 A | 11/1992 | Vollmer | |
| 5,419,147 A | 5/1995 | Cooper | |
| 6,010,312 A | 1/2000 | Suitou et al. | |

(Continued)

FOREIGN PATENT DOCUMENTS

| CA | 2930249 A1 | 5/2015 |
|---|---|---|
| CN | 203466682 U | 3/2014 |

(Continued)

OTHER PUBLICATIONS

"Cool n Save", http://www.coolnsave.com, accessed on the internet on Jan. 12, 2016.

(Continued)

*Primary Examiner* — Robert A Hopkins
(74) *Attorney, Agent, or Firm* — Howard L. Speight, PLLC

(57) ABSTRACT

An apparatus includes a housing that includes a front face, a rear face, a front-face cut out on the front face, a rear-face cut out on the rear face, a front-face screen to cover the front-face cut out, and a rear-face screen to cover the rear-face cut out. A box insertable between the front face and the rear face. The box includes a plurality of wicks behind the front face of the housing when the box is inserted in the housing. The box includes a water connection fitting coupled to the plurality of wicks through a controllable valve. The controllable valve has an open position and closed position.

12 Claims, 15 Drawing Sheets

(56) References Cited

U.S. PATENT DOCUMENTS

| | | | |
|---|---|---|---|
| 6,100,807 | A | 8/2000 | Orr |
| 6,201,313 | B1 | 3/2001 | Nakamats |
| 6,420,801 | B1 | 7/2002 | Seefeldt |
| 6,619,059 | B1 | 9/2003 | Johnson |
| 6,655,162 | B2 | 12/2003 | McKee |
| 6,837,065 | B2 | 1/2005 | Permetti |
| 7,080,519 | B1 | 7/2006 | Johnson |
| 7,441,412 | B2 | 10/2008 | Jensen |
| 7,538,447 | B1 | 5/2009 | Berenda et al. |
| 7,571,865 | B2 | 8/2009 | Nicodem et al. |
| 7,575,182 | B2 | 8/2009 | Michael |
| 7,809,472 | B1 * | 10/2010 | Silva .................. F24F 3/065 165/200 |
| 8,359,875 | B2 | 1/2013 | Matracea et al. |
| 8,950,205 | B2 | 2/2015 | Matracea et al. |
| 9,134,039 | B1 | 9/2015 | Nachefski |
| 2003/0167139 | A1 | 9/2003 | Swartz et al. |
| 2003/0221440 | A1 | 12/2003 | Limehouse |
| 2007/0109121 | A1 | 5/2007 | Cohen |
| 2008/0104980 | A1 | 5/2008 | Payton |
| 2009/0273471 | A1 | 11/2009 | Pellegrino et al. |
| 2009/0308090 | A1 | 12/2009 | Matracea et al. |
| 2010/0119374 | A1 | 5/2010 | Wood |
| 2010/0229586 | A1 | 9/2010 | Nicodem |
| 2011/0178610 | A1 | 7/2011 | Gamble et al. |
| 2012/0072167 | A1 | 3/2012 | Cretella, Jr. et al. |
| 2012/0141200 | A1 | 6/2012 | Kaura et al. |

FOREIGN PATENT DOCUMENTS

| | | |
|---|---|---|
| CN | 104748333 A | 7/2015 |
| CN | 105134497 A | 12/2015 |
| EP | 2161443 A2 | 3/2010 |
| KR | 20130120601 A | 11/2013 |
| KR | 20150043500 A | 4/2015 |
| KR | 20150094333 A | 8/2015 |
| WO | 0235461 A1 | 5/2002 |
| WO | 2007133538 A2 | 11/2007 |
| WO | 2011011856 A1 | 2/2011 |
| WO | 2013068556 A1 | 5/2013 |

OTHER PUBLICATIONS

United States Patent and Trademark Office, Notice of Non-Final Office Action, U.S. Appl. No. 14/880,888, which is a US parent of the instant application, dated Dec. 15, 2015.

United States Patent and Trademark Office, Notice of Final Office Action, U.S. Appl. No. 14/880,888, which is a child of a related US application (U.S. Appl. No. 13/482,815), dated Mar. 29, 2016.

International Searching Authority, Patent Cooperation Treaty, International Search Report and Written Opinion, International application No. PCT/US2016/034592, which is a child PCT matter to the instant application, dated Nov. 9, 2016.

United States Patent and Trademark Office, Notice of Non-Final Office Action, U.S. Appl. No. 14/880,888, which is a US related matter to the instant application, dated Aug. 29, 2016.

United States Patent and Trademark Office, Notice of Allowance and Fee(s) Due, U.S. Appl. No. 13/482,815, which is the US parent of U.S. Appl. No. 14/495,466, which is US parent to the instant application, dated Aug. 26, 2015.

United States Patent and Trademark Office, Notice of Allowance and Fee(s) Due, U.S. Appl. No. 14/495,466, which is the US parent to the instant application, dated May 13, 2015.

Blueskywindpower, HVAC Wind Turbine, https://www.youtube.com/watch?v=pwE3UISmTh8, accessed on Jul. 27, 2017.

Blue-Sky-Windpower, https://squareup.com/store/blue-sky-windpower/item/hvac-wind-turbine, Square, Inc. US, Joplin, MO 64804, accessed on Dec. 19, 2017.

International Searching Authority, Patent Cooperation Treaty, International Search Report and Written Opinion, International application No. PCT/US2017/048454, which is a related PCT matter to the instant application, dated Nov. 21, 2017.

Rfarevalo, Wind turbine break-in by the use of air conditioner exhaust = Free Power, https://www.youtube.com/watch?v=gSFKRBiytxc; accessed on Dec. 19, 2017.

Tool Using Animal in Energy, Parasitic Wind Turbine, http://www.instructables.com/id/Parasitic-Wind-Turbine/, www.instructables.com., accessed on Dec. 19, 2017.

\* cited by examiner

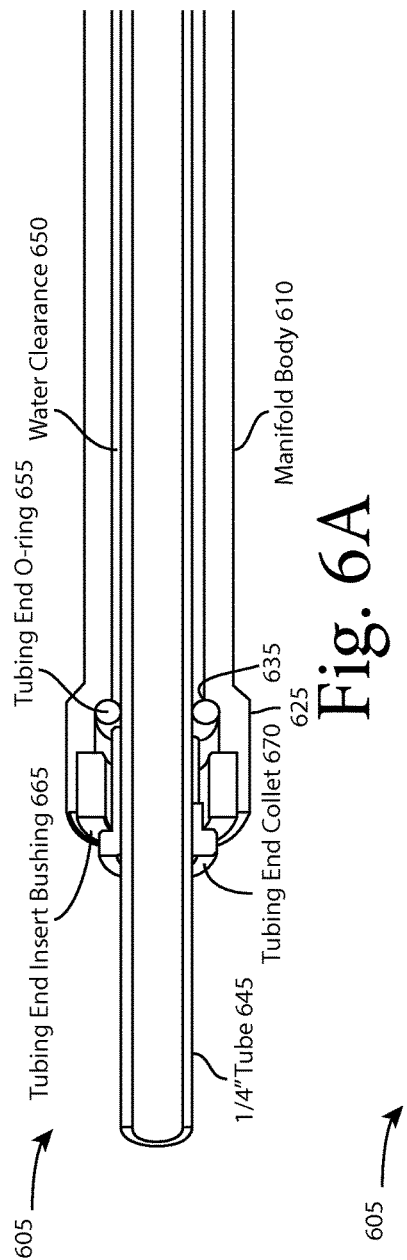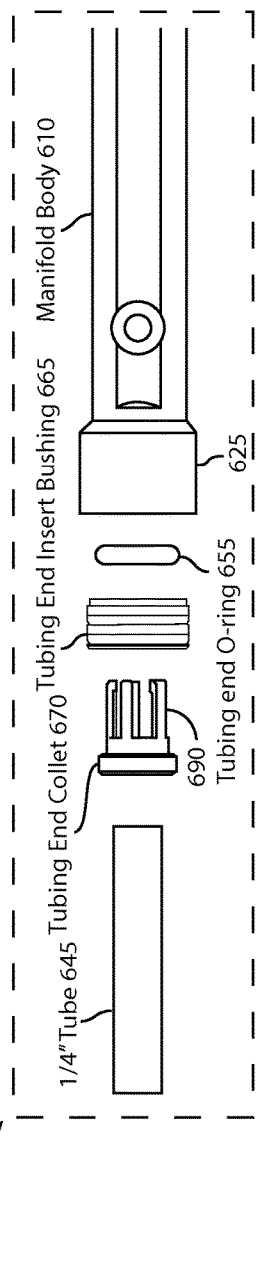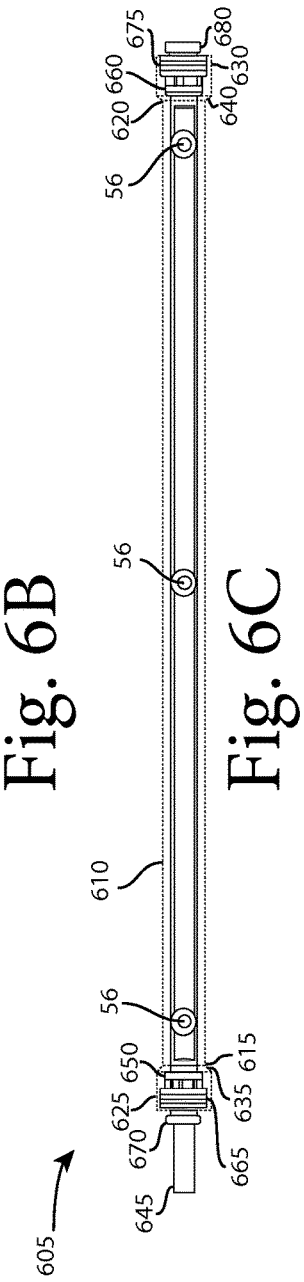

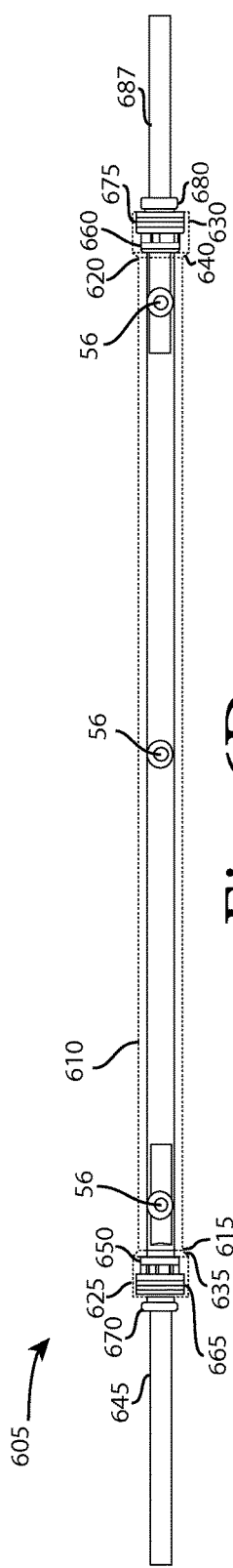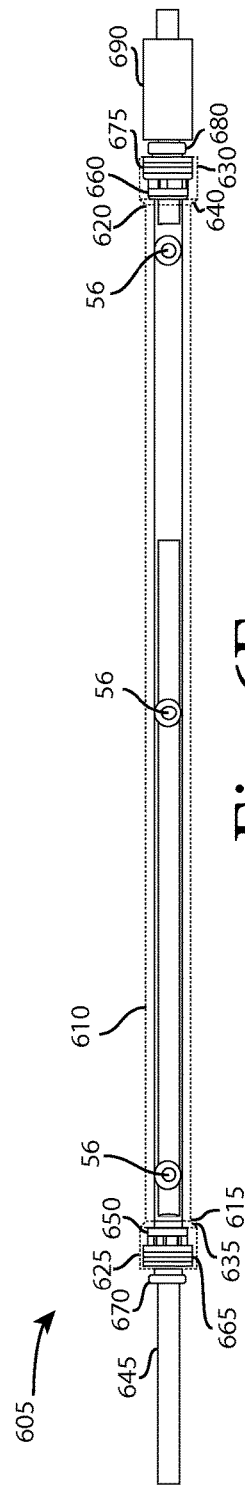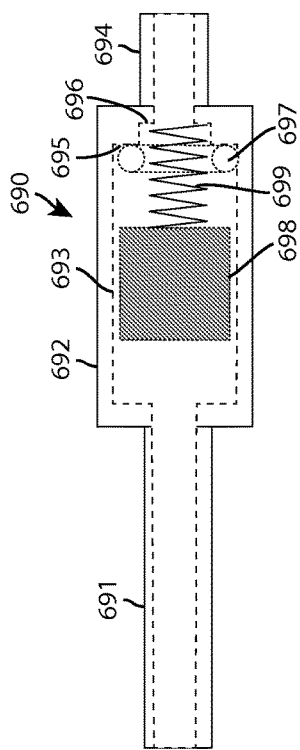

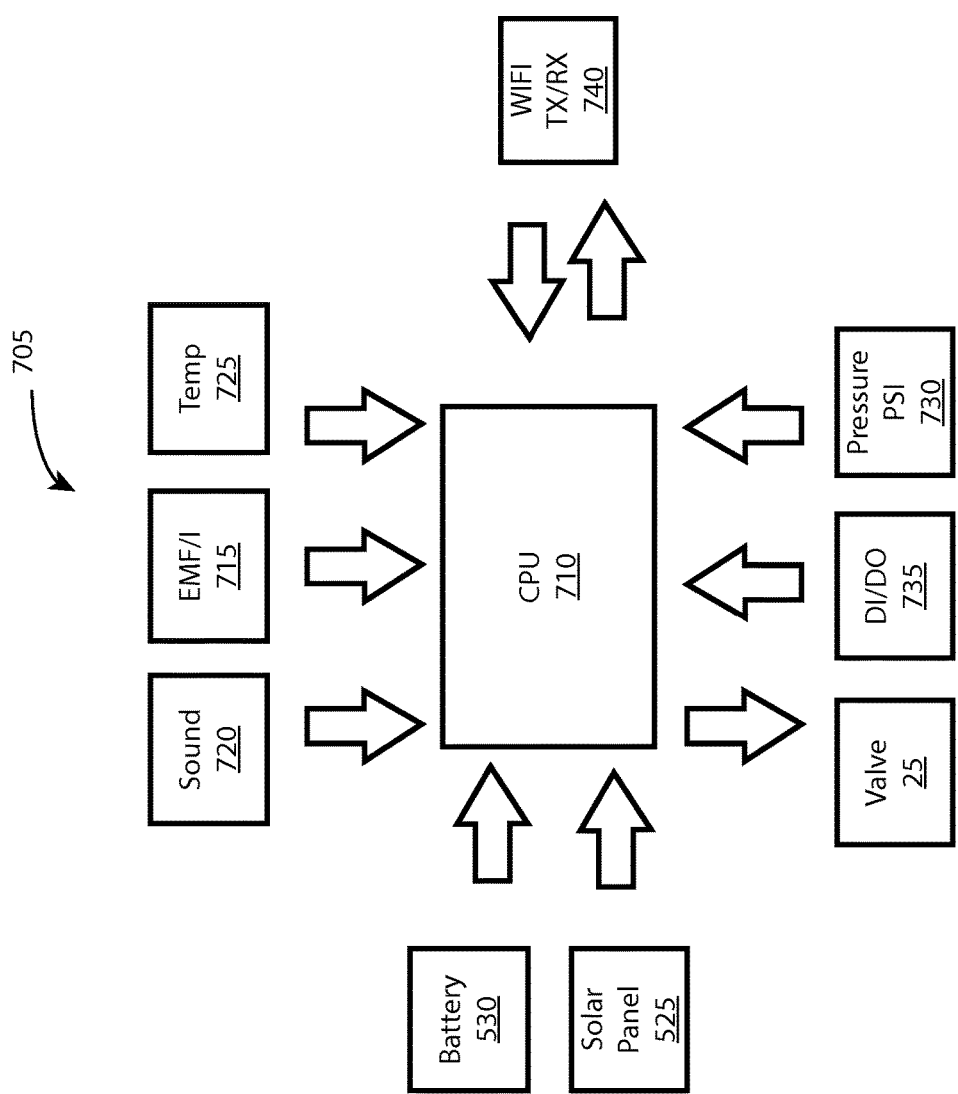

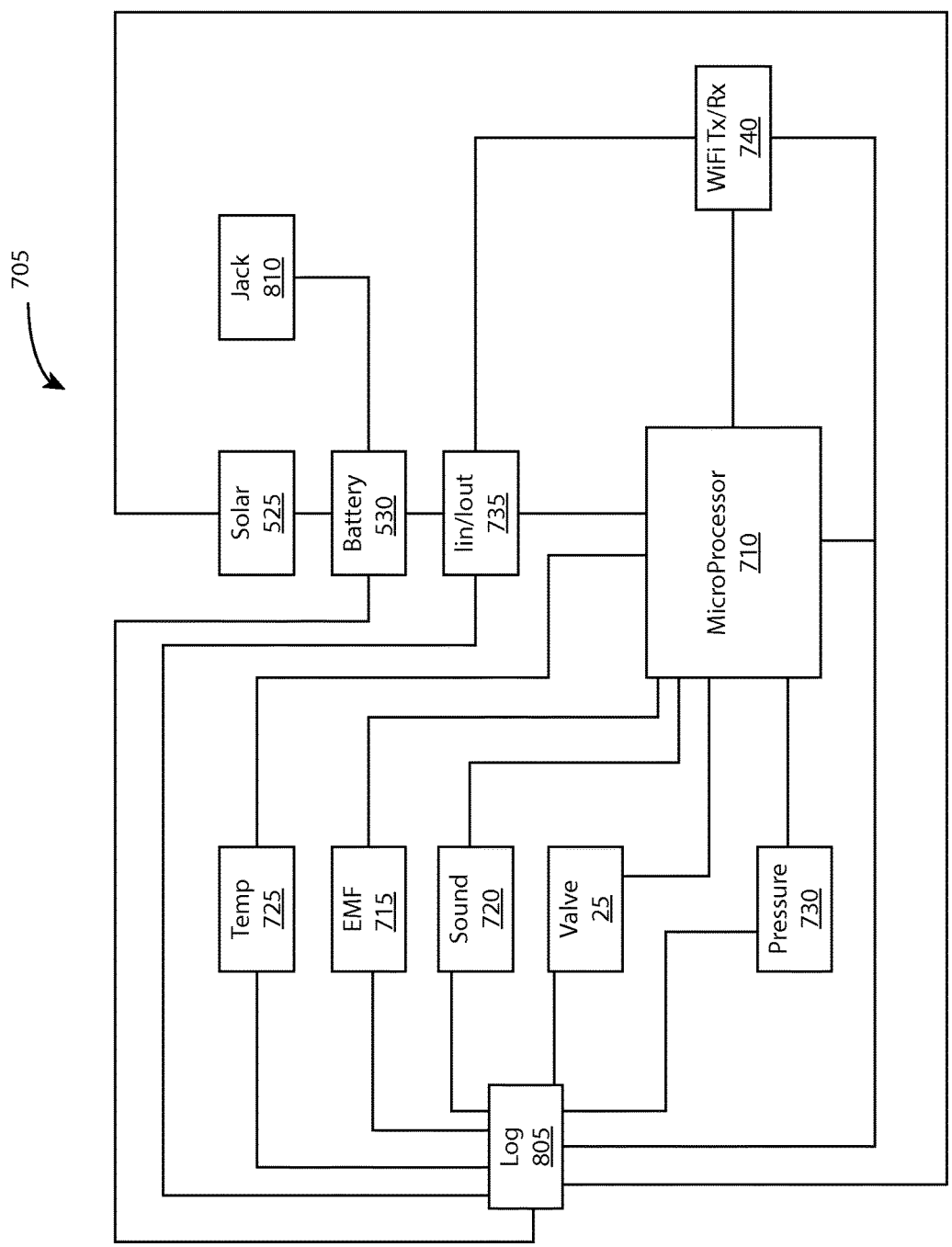

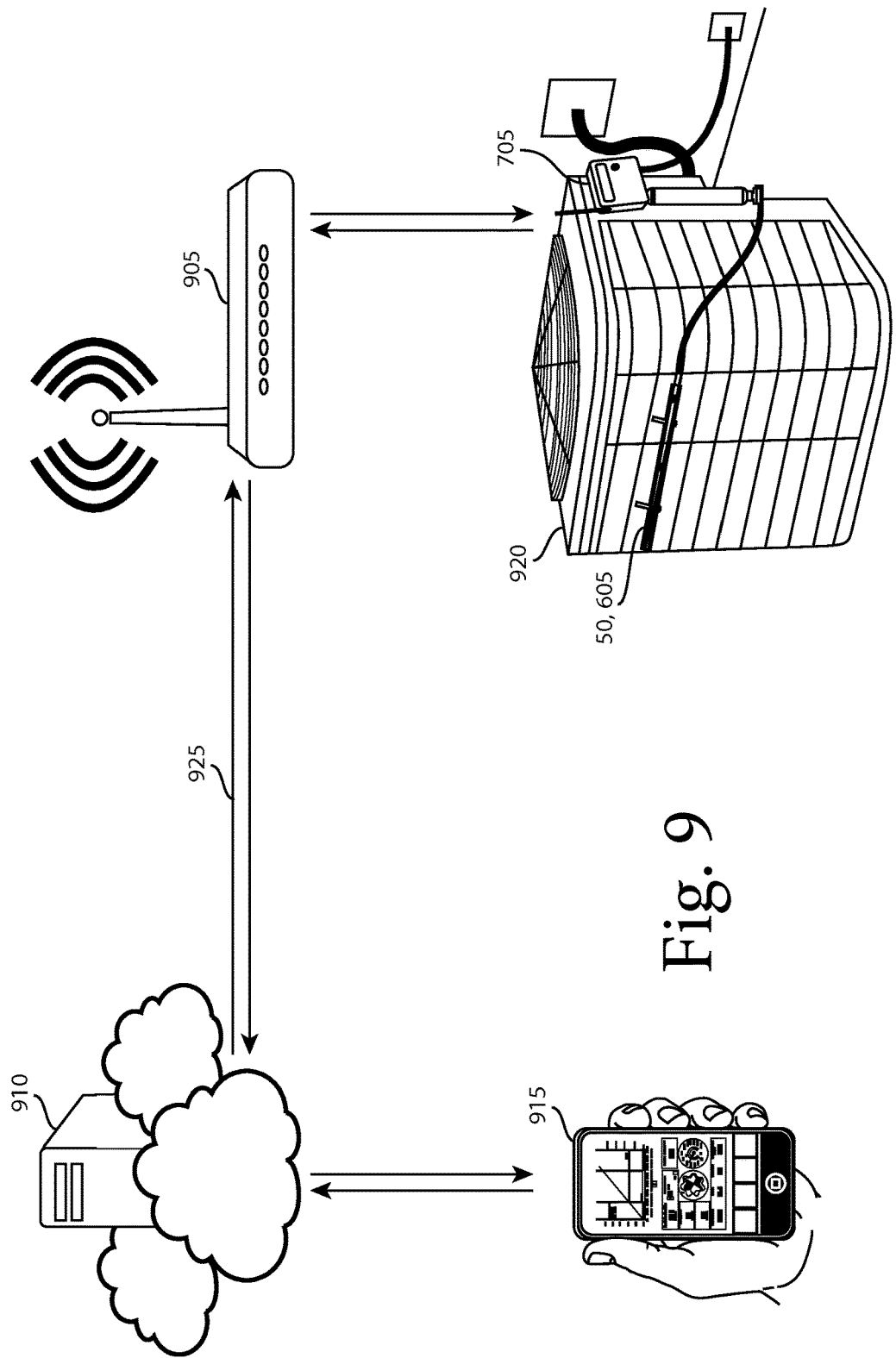

AIR CONDITIONER MISTER, APPARATUS AND METHOD

CROSS-REFERENCE TO RELATED APPLICATIONS

This application is a continuation-in-part of U.S. patent application Ser. No. 14/495,466, filed Sep. 24, 2014, entitled "Air Conditioner Mister, Apparatus and Method," which is a continuation-in-part of U.S. patent application Ser. No. 13/482,815, filed May 29, 2012 entitled "Air Conditioner Mister, Apparatus and Method," both of which are incorporated by reference. This application claims the benefit of U.S. Provisional Application No. 62/174,045, filed Jun. 11, 2015, which is incorporated by reference.

BACKGROUND

The present disclosure relates generally to an apparatus and method for cooling an air conditioner system in order to boost the efficiency thereof. In order to better understand the disclosure, some background on the operation of an air conditioner system may be helpful.

Willis Haviland Carrier developed the first modern air conditioning system in 1902. It was designed to solve a humidity problem at the Sackett-Wilhelms Lithographing and Publishing Company in Brooklyn, N.Y. Paper stock at the plant would sometimes absorb moisture from the warm summer air, making it difficult to apply the layered inking techniques of the time. Carrier treated the air inside the building by blowing it across chilled pipes. The air cooled as it passed across the cold pipes, and since cool air cannot carry as much moisture as warm air, the process reduced the humidity in the plant and stabilized the moisture content of the paper. Reducing the humidity also had the side benefit of lowering the air temperature, and a new technology was born.

The actual process air conditioners use to reduce the ambient air temperature in a room is based on a simple scientific principle. The rest is achieved with the application of a few clever mechanical techniques. Air conditioners use refrigeration to chill indoor air, taking advantage of a physical law—when a liquid converts to a gas (in a process called phase conversion), it absorbs heat. Air conditioners exploit this feature of phase conversion by forcing special chemical compounds to evaporate and condense over and over again in a closed system of coils.

The compounds involved are refrigerants that have properties enabling them to change at relatively low temperatures. Air conditioners also contain fans that move warm interior air over these cold, refrigerant-filled coils. In fact, central air conditioners have a whole system of ducts designed to funnel air to and from these serpentine, air-chilling coils.

When hot air flows over the cold, low-pressure evaporator coils, the refrigerant inside absorbs heat as it changes from a liquid to a gaseous state. To keep cooling efficiently, the air conditioner has to convert the refrigerant gas back to a liquid again. To do that, a compressor puts the gas under high pressure, which is a process that creates unwanted heat. All the extra heat created by compressing the gas is then evacuated to the outdoors with the help of a second set of coils called condenser coils, and a second fan. As the gas cools, it changes back to a liquid, and the process starts all over again. The process can be thought of as an endless cycle: liquid refrigerant, phase conversion to a gas, heat absorption, compression, and phase transition back to a liquid again.

The major parts of an air conditioner manage refrigerant and move air in two directions: indoors and outside. The parts consist of:

Evaporator—Receives the liquid refrigerant;
Condenser—Facilitates heat transfer;
Expansion valve—regulates refrigerant flow into the evaporator;
Compressor—A pump that pressurizes refrigerant.

The cold side of an air conditioner contains the evaporator and a fan that blows air over the chilled coils and into the room. The hot side contains the compressor, condenser, and another fan to vent hot air coming off the compressed refrigerant to the outdoors. In between the two sets of coils, there typically is an expansion valve. It regulates the amount of compressed liquid refrigerant moving into the evaporator. Once in the evaporator, the refrigerant experiences a pressure drop, expands, and changes back into a gas. The compressor typically is an electric pump that pressurizes the refrigerant gas as part of the process of turning it back into a liquid. There are some additional sensors, timers and valves, but the evaporator, compressor, condenser, and expansion valve are the main components of an air conditioner.

Most air conditioners have their capacity rated in British thermal units (Btu). A Btu is the amount of heat necessary to raise the temperature of 1 pound (0.45 kilograms) of water one degree Fahrenheit (0.56 degrees Celsius). One Btu equals 1,055 joules. In heating and cooling terms, one ton equals 12,000 Btu.

A typical window unit air conditioner might be rated at 10,000 Btu. For comparison, a typical 2,000-square-foot (185.8 square meters) house might have a 5-ton (60,000-Btu) air conditioning system, implying that a person might need perhaps 30 Btu per square foot. These are rough estimates. The energy efficiency rating (EER) of an air conditioner is its Btu rating over its wattage. As an example, if a 10,000-Btu air conditioner consumes 1,200 watts, its EER is 8.3 (10,000 Btu/1,200 watts). Obviously, one would like the EER to be as high as possible, but normally a higher EER is accompanied by a higher price.

The following example helps illustrate the process of selecting the most economical/efficient air conditioning system. Suppose you have a choice between two 10,000-Btu units. One has an EER of 8.3 and consumes 1,200 watts, and the other has an EER of 10 and consumes 1,000 watts. Suppose also that the price difference between the two units is $100. To determine the payback period on the more expensive unit, you need to know approximately how many hours per year you will be operating the air conditioner and how much a kilowatt-hour (kWh) costs in your area. Assume you plan to use the air conditioner six hours a day for four months of the year, at a cost of $0.10/kWh. The difference in energy consumption between the two units is 200 watts. This means that every five hours the less expensive unit will consume one additional kWh (or $0.10) more than the more expensive unit.

With roughly 30 days in a month, you are operating the air conditioner:

$$4 \text{ months} \times 30 \text{ days per month} \times 6 \text{ hours per day} = 720 \text{ hours}$$

$$[(720 \text{ hours} \times 200 \text{ watts})/(1000 \text{ watts/kilowatt})] \times \$0.10/\text{kilowatt hours} = \$14.40$$

The more expensive air conditioning unit costs $100 more to purchase but less money to operate. In our example, it will take seven years (7×$14.40=$100.80) for the higher priced unit to break even. Because of the rising costs of electricity and a growing trend to "go green," more people are turning to alternative cooling methods to spare their pocketbooks and the environment. Nevertheless, as the above description shows, substantial savings can also be had by increasing the efficiency of an existing air conditioner unit. One way of doing that is by employing the method and apparatus of the present invention, which uses less energy to achieve the same or greater performance.

SUMMARY OF THE INVENTION

The present disclosure provides an alternative to the ever-increasing cost of electricity and the corresponding cost burden of using an air conditioner. As described in more detail below, the present disclosure reduces the amount of energy needed to condense the refrigerant on the hot side of the air conditioning system. Specifically, the present disclosure provides a novel system for spraying a mist of water on the air conditioner's condensing coils so that, as the water hits the coils and evaporates, it reduces the temperature of the coils. This reduced temperature assists in more rapidly reducing the temperature of the refrigerant inside the condenser and more rapidly enables the refrigerant to change from a gas to a liquid. The more rapidly this process takes place, the less electricity needed (by the compressor, fan, etc.) to complete that process. The less electricity needed, the less the cost to run the system. Likewise, the less the compressor and fan are required to run to do their job, the longer they will last and not need to be replaced.

BRIEF DESCRIPTION OF THE DRAWINGS

FIG. 6A is a cross-sectional view of an adjustable manifold.
FIG. 6B is an exploded view of one end of an adjustable manifold.
FIG. 6C is a plan view of an adjustable manifold.
FIG. 6D is plan view of daisy-chained adjustable manifolds.
FIG. 6E is a plan view of a final adjustable manifold in daisy-chained adjustable manifolds.
FIG. 6F is a cross-sectional view of an air bleeding check valve.
FIG. 7 is a block diagram of a wireless misting controller.
FIG. 8 is a block diagram of a wireless misting controller.
FIG. 9 is a block diagram of a misting system with wireless communication.

DETAILED DESCRIPTION

The following detailed description illustrates embodiments of the present disclosure. These embodiments are described in sufficient detail to enable a person of ordinary skill in the art to practice these embodiments without undue experimentation. It should be understood, however, that the embodiments and examples described herein are given by way of illustration only, and not by way of limitation. Various substitutions, modifications, additions, and rearrangements may be made that remain potential applications of the disclosed techniques. Therefore, the description that follows is not to be taken as limiting on the scope of the appended claims. In particular, an element associated with a particular embodiment should not be limited to association with that particular embodiment but should be assumed to be capable of association with any embodiment discussed herein.

Figure 1:
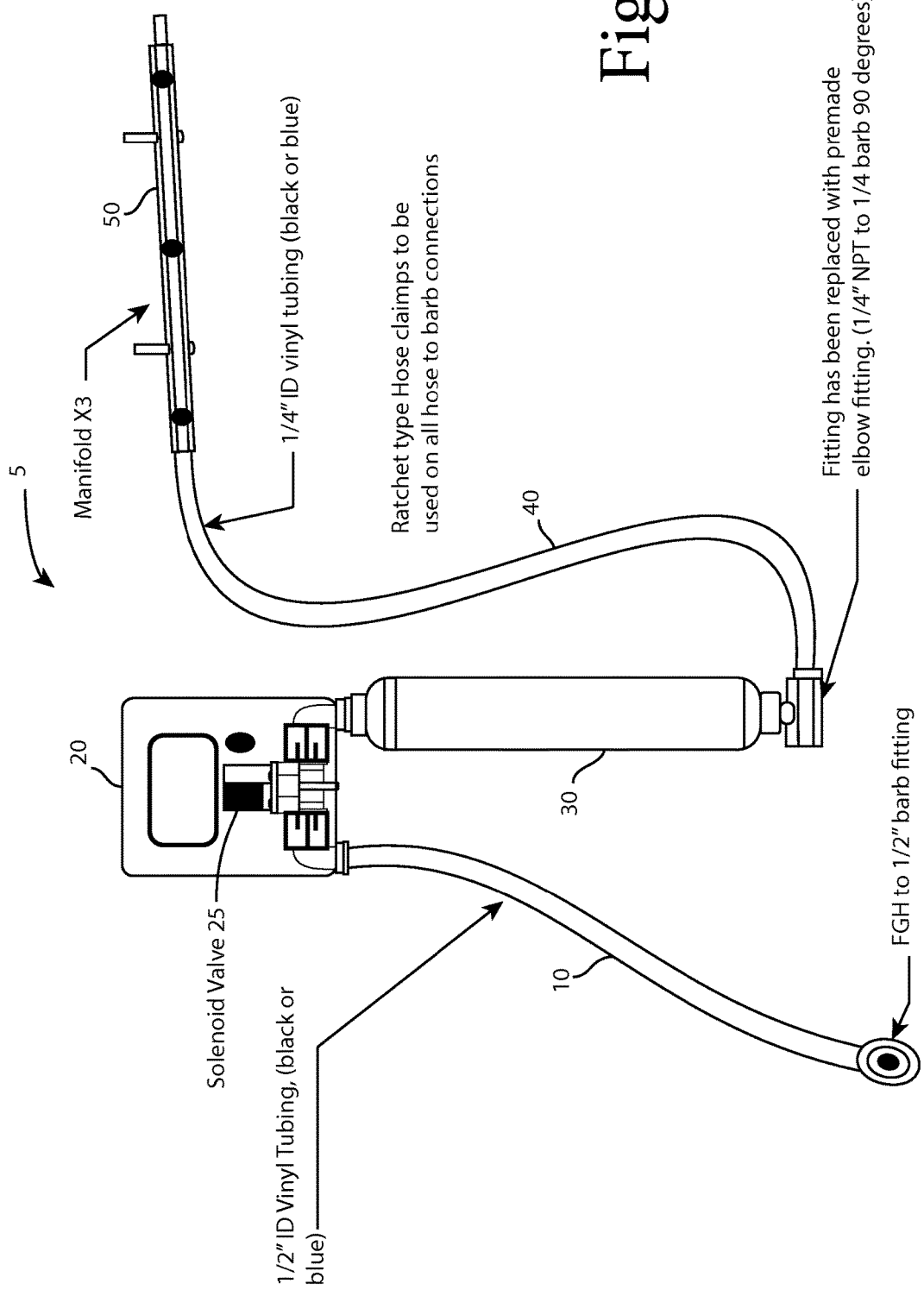
FIG. 1 is a plan view of a misting system including a supply hose, controller, filter and manifold.

Referring initially to FIG. 1, a misting system 5 is illustrated. The misting system 5 may include a first supply hose 10, a control box 20, a filter 30, a second supply hose 40, and a manifold 50. The first supply hose 10 may be constructed from ½ inch vinyl tubing and connects to a water supply source (not shown) at a first end and to an input on control box 20 at a second end. The control box 20 may house a solenoid valve 25 and circuitry (not shown) programmable to control operation of the misting system 5. The first end of filter 30 connects to an output of control box 20, whereas a second end of filter 30 connects to a first end of second supply hose 40. The supply hose 40 may be constructed from ¼ inch vinyl tubing. A second end of supply hose 40 may connect to manifold 50.

Figure 2:
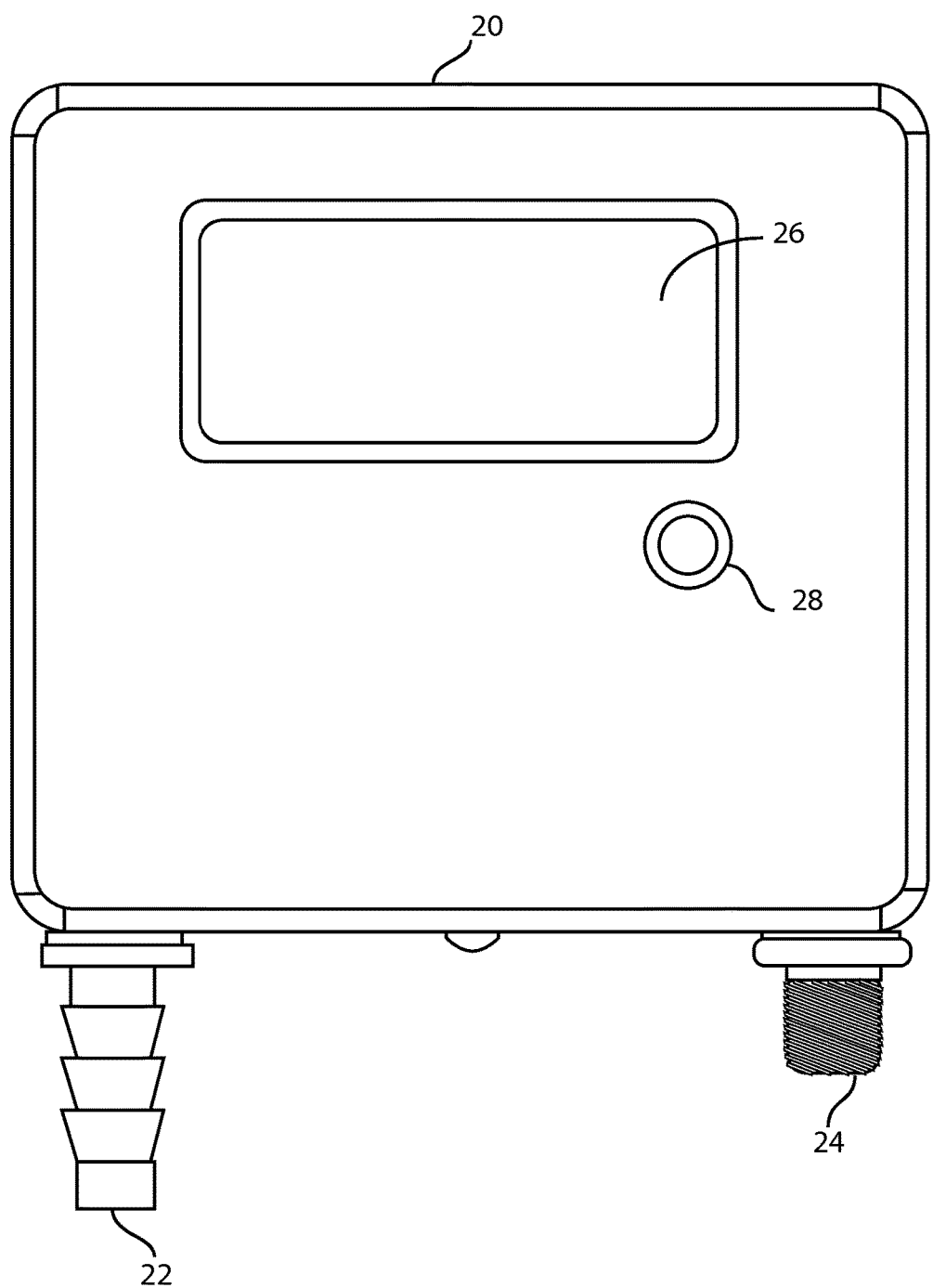
FIG. 2 is a plan view of a control box

Referring to FIG. 2, the control box 20 is illustrated. As shown, the control box 20 may include an input 22, an output 24, a button selector 28, and an LCD view screen 26. Control box 20 may also include a port for receiving an electrical signal and/or an antenna for receiving a wireless signal where, as described in more detail below, the received signal(s) can be used to control the programming and/or operation of control box 20.

Figure 3:
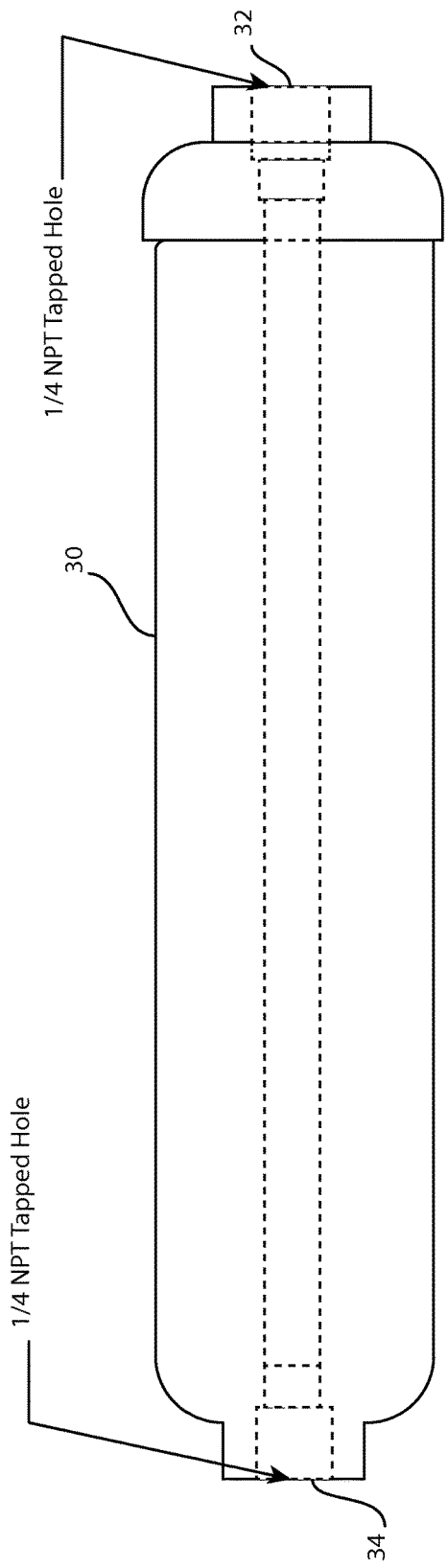
FIG. 3 is a cross-sectional view of a filter.

Referring to FIG. 3, the filter 30 is illustrated. As shown, the filter 30 may include an input 32 and an output 34.

Figure 4:
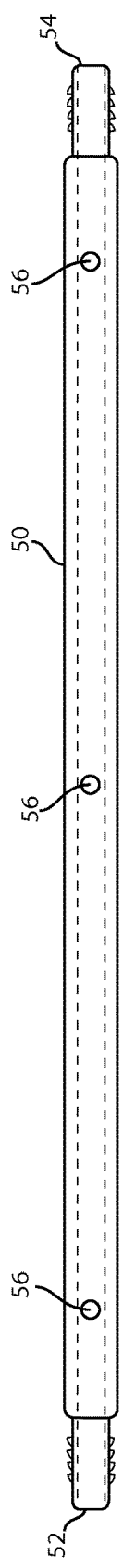
FIG. 4 is a plan view of a manifold.

Referring to FIG. 4, the manifold 50 is illustrated. As shown, the manifold 50 may include an input 52, an output 54, and a spray nozzles 56. While three spray nozzles 56 are depicted, different numbers can be chosen depending on the need for the particular application.

The misting system 5 depicted in FIG. 1 may operate as follows. The first end of supply hose 10 is connected to a water source (not shown), such as a water faucet on the exterior of a home. When the water supply is turned on, water flows from the source, through the first supply hose 10, and into the control box 20. The control box 20 may include a solenoid valve 25 that opens and closes under the program control of the control box 20. When the solenoid valve 25 is closed, no water flows through the control box 20. When the solenoid valve 25 is open, water flows through the control box 20 and into the filter 30.

As will be described in more detail below in connection with FIG. 3, the filter 30 softens the water flowing therethrough so as to reduce mineral build-up in the second supply hose 40, the manifold 50, and on any surface in the air conditioner unit that gets wet as a result of using the apparatus. Locating the filter 30 on the downstream side of the control box 20 means that it is not under constant water pressure, as it would be if it were located on the upstream side of control box 20. This may extend the life of the filter 30.

Next, as water flows through the filter 30 and the second supply hose 40, it enters the manifold 50. The water at this point is under pressure from its supply and the reduced diameter of the second supply hose 40. Other methods may be used for adjusting the pressure of the water supplied to the manifold 50. Water enters the manifold 50 and exits, under pressure, through the spray nozzles 56. The manifold 50 is positioned on the air conditioner system so that the exiting water spray primarily falls on the air conditioner's condenser. As explained above, this water and its evaporation cool the condenser, thereby aiding in the cooling of the refrigerant inside, and reducing the time/power necessary to cool the refrigerant.

As will be appreciated by those skilled in the art, one or more manifolds 50 can be employed depending on the configuration desired. For example, a single manifold 50 can be used on one side of the air conditioner unit. Alternatively, additional manifold units 50 can be connected together by uniting them at their inputs/outputs shown in FIGS. 4, 5A-5C (discussed below). For example, using four manifold units 50 would enable a user to place one manifold 50 on each of the four sides of an air conditioner so that the water spray would enter the air conditioner from all sides. Depending on the configuration, this may add to the volume of water falling on the condenser inside the air conditioner unit. Likewise, more than one manifold unit 50 could be placed on the same side of the air conditioner if that proved to be the best way of misting the condenser.

In or more embodiments, a drain (not shown) is added to the valve between the filter 30 and the manifold 50. This drain valve would open when the misting system 5 is not on in order to drain water from manifold 50, the second supply hose 40, and the filter 30.

The time that the misting system 5 operates may also be important. For example, no water should be flowing if the air conditioner unit is not running Control of the water supply is managed by programmable circuitry inside control box 20 (in order to open/close the solenoid valve 25) with the aid of one or more of the inputs/metrics shown in FIG. 5, as discussed below.

The control box 20 may house a central processing unit (CPU) 505 that operates under program control. In one embodiment, the CPU 505 uses three sources of information to decide when to initiate (i.e., open) the solenoid valve 25. The CPU 505 receives information from an electromagnetic field (EMF) detector 510, which measures electromagnetic fields generated by the compressor's induction motor, an acoustic detector 515, which measures acoustic levels, and a temperature sensor 520, which measures the ambient temperature near the control box 20. All three measurements are amplitude based. Because the apparatus typically is either full on or full off, it typically only cares about peak amplitudes of each metric. The CPU 505 uses the measured data to determine when to run the misting system 5.

Temperature

Water based pre-cooling begins to lose efficiency the closer the water temperature is to the ambient temperature. Tests have shown 78 degrees Fahrenheit to be the best all around temperature based cutoff. Thus, in this embodiment, if the temperature sensor 520 reads less than a threshold, such as 78 degrees Fahrenheit, the CPU 505 will sense that and disable the unit (i.e., it will not allow the solenoid valve 25 to open).

Acoustics

The acoustics section uses the amplitude of the sound waves generated by the running compressor and fan as a turn-on verification. When a predetermined appropriate noise threshold is met (as sensed by the acoustic detector 515 and delivered to the CPU 505), the CPU 505 will allow the misting system 5 to arm (i.e., capable of turning on the solenoid valve 25 if other parameters are met). This is a method the CPU 605 uses to confirm the compressor is running. As indicated, having this threshold met alone will not turn the misting system 5 on, it is used merely as a "go, no go" signal to the CPU 505.

Electromagnetic Field/Compressor Current Detection

When the compressor motor turns on, it generates strong EMF around its core. The CPU 505 is equipped with an antenna system (EMF detector 510 in FIG. 5) designed to pick up and measure these fields. Using EMF to gauge operation allows the unit to discriminate between local AC systems (when the misting system 5 is installed on multiple compressor systems) as well as tell the CPU 505 when it is the proper time to turn on the misting system 5. The misting system 5 preferably should only run when the compressor is on.

Accordingly, in this embodiment, the CPU 505 senses temperature, acoustics, and EMF. The CPU 505 will only cause the solenoid valve 25 to open if each of these metrics is met. In other words, in this particular embodiment, the solenoid valve 25 will open if the ambient air temperature is at least 78 degrees Fahrenheit, the acoustic detector 515 detects a sufficient level of "noise", and the EMF detector 510 detects a sufficient level of EMF. If all three of these metrics are met, the CPU 505 will issue a command to open the solenoid valve 25 and allow water to traverse the solenoid valve 25 and ultimately mist the air conditioner unit. If any one of these metrics are not met, the CPU 505 will not open the solenoid valve 25, thereby preventing any water from traversing the valve.

In yet another embodiment, the CPU 505 can receive a wired or wireless input signal that further controls (or assists in the control of) the solenoid valve 25. In this embodiment, for example, the received/input signal could be activated, thereby telling the CPU 505 to (1) either override the other inputs and open (or close) the solenoid valve 25 or (2) operate as another input for the controller to consider when deciding to open (or close) the solenoid valve 25. The wired input signal can emanate from any source, such as a manual or programmable on/off switch, a home automation system, a thermostat, an alarm system, etc. Similarly, the wireless input signal can be generated by receipt of a wireless signal from any source, such as an IEEE 802.11 or a Bluetooth compliant signal delivered by any device capable of communicating using either standard. For example, the state of the input signal could be controlled by a handheld remote control, or a web or mobile application that allows its user to activate the input signal in order to control (or assist the control of) the solenoid valve. In the case of web or mobile applications (as with an appropriate hard-wire signal), they could also be designed to enable the user to reprogram the CPU 505 to open/close the solenoid valve 25 based on a different combination of inputs than the combinations described above.

Those skilled in the art will appreciate that other metrics can be used, including more, less, and/or different metrics. Likewise, variants of the preferred components of the misting system 5, as described below, are within the scope of the present disclosure.

Manifold

The misting system 5 may include a plurality (e.g., three) of manifolds 50, each with three mister nozzles 56 attached. The nozzles 56 are rated for 5.4 gph @ 80 psi and have an orifice of 0.04 mm. While the manifold 50 can be any shape, the manifold may have a flat side to host the nozzles 56. A flat surface enables a nozzle o-ring (not shown) to properly seat between the nozzle 56 and the side, so as to best prevent water leakage and provide optimal spray out of the nozzle. Additional manifolds 50 can be added, as can manifolds 50 with more (or less) mister nozzles attached. As will be appreciated by those skilled in the art, as mister nozzles 56 are added, the flow rate increases.

Filters

The filter 30 may be made by Electrical Appliances Ltd. In one or more embodiments, the filters are standard 10"×2" cylindrical cartridge filters 30 often seen on ice makers. The filters 30 may have ½" national pipe thread (npt) ports and are made of low density (LD) polyethylene. In one or more embodiments, the filtration media is Sodium Polyphosphate. Siliphos (for short) is a crystal-based media that dissolves slowly as water passes over it. When dissolved, its molecules prevent iron, calcium, magnesium (the constituents of water scale) from forming residue that could clog the misting system 5 as well as damage the air conditioner's cooling system.

Valve

Figure 5:
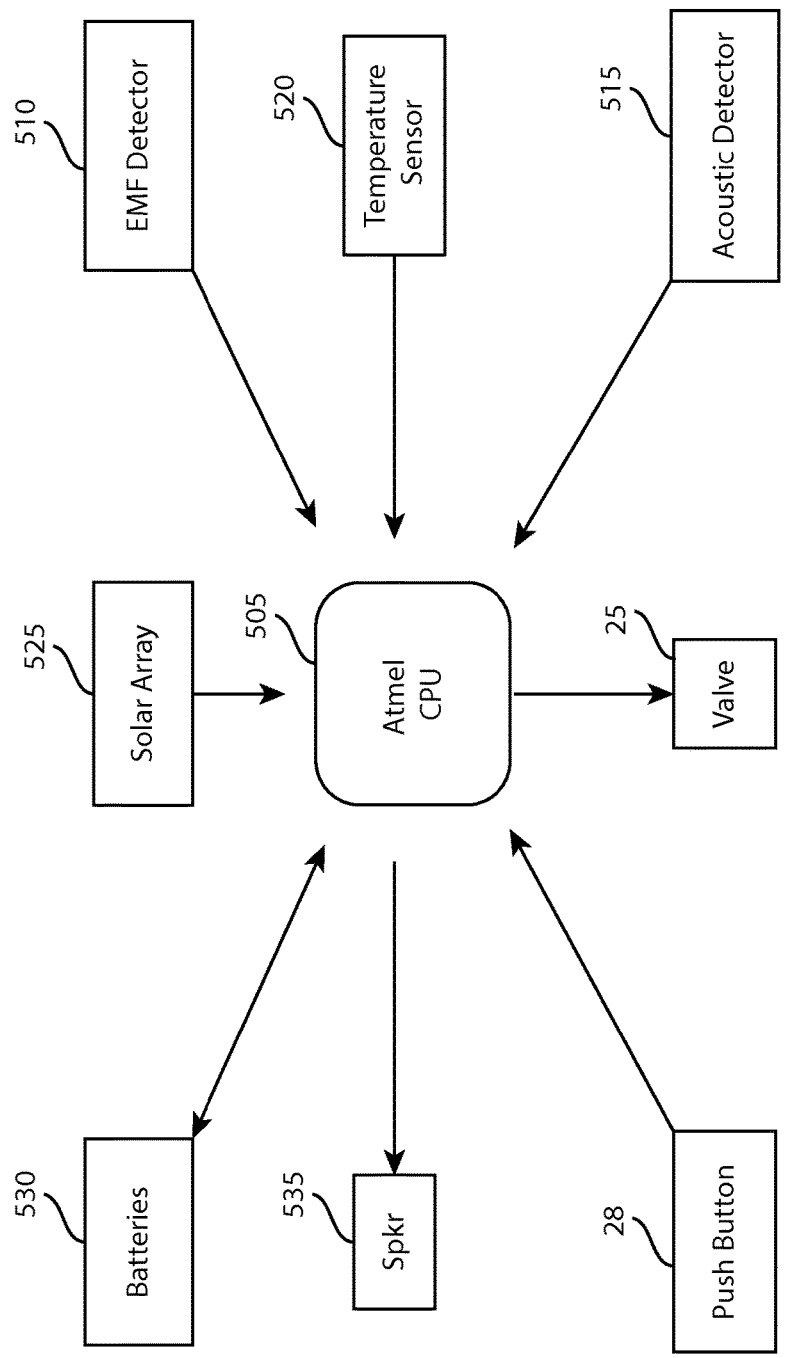
FIG. 5 illustrates control inputs used for controlling a misting system.

As described above, the solenoid valve 25 is the heart of the CPU's 505 control of the misting system 5 because it controls when the water flows to the manifold 50. A person of ordinary skill would understand that solenoid valve 25 could be replaced by a different kind of valve (e.g., an electrically operated ball valve). In embodiments where the misting system 5 is solar powered (using the solar array 525 as shown in FIG. 5), a special consideration is how much power the valve consumes. Traditional solenoid valves do not work well because they require power to be constantly applied to stay open. For example, the valve may use a 22 millisecond (ms)+/−10% positive polarity pulse to latch the valve open and a 44 ms+/−10% negative polarity pulse to latch the valve closed. No other power is required to keep the valve open after the initial open signal is sent. When it is time to close the valve, a short negative going pulse is applied to the solenoid valve 25 and it latches closed.

Batteries

In one or more embodiments, batteries 530 (as illustrated in FIG. 5) are standard AA 1.5V nominal at 2,500 mAH units. If a solar array is used, the standard AA batteries are replaced by a rechargeable battery pack. In one or more embodiments, four batteries 530 typically are required for operation, and with the solar array trickle 525 charging the pack during daylight hours, the battery pack will last at least six months without needing to be replaced.

User Interface

In one or more embodiments, interfacing with the misting system 5 is achieved via one ductile weather proof rubberized push button switch (such as button selector 28, see FIG. 2) mounted on the exterior of the control box 20 (see FIG. 2) and a piezo speaker 535 located within the control box 20 (see FIG. 5). Using a system of button pushes and audio feedback, the user can set up the misting system 5. Other embodiments of the disclosure can use more push buttons for added functionality. In one or more embodiments, the misting system 5 can be set up remotely by way of a mobile device or a cloud based system as described below.

Solar Array

In one or more embodiments, the solar array 525 is a 9 Volt (V) 200 milliampere (ma) crystal metal matrix solar array 525 that helps keep the batteries 530 topped off and extends the misting system's 5 autonomous run time. The CPU 505 may have battery management/solar charger software installed, and it handles the job of battery pack maintenance and charging via solar energy.

CPU

In one or more embodiments, the CPU 505 is an 8-bit microcontroller (e.g., the ATtinymega88 series provided by Atmel). All functions of the controller are encoded and controlled via software. This not only allows for precision when it comes to control, measurements, and management, but it also lends itself to future proofing of the misting system 5. During the lifetime of the product, it may be desirable to fine tune and make changes to the control architecture and protocol of the misting system 5. Because the control box 20 preferably has a programming port (not shown), that enables updates of previously manufactured systems to current firmware.

In one or more embodiments, during initial set up, the misting system 5 needs to be calibrated to the specific compressor system that it is installed on. Calibration ensures that the misting system 5 function is tailored to each individual installation. Upon initial assembly and set up, the unit is powered on with the control button (see button selector 28 in FIG. 2) depressed. After 5 seconds, the control box 20 is programmed to enter calibration mode. The control box 20 will stay in the calibration mode until told otherwise. When the compressor turns on, the CPU 505 will, in one or more embodiments, set its thresholds within approximately 10 seconds. When the CPU 505 has enough information to set the proper thresholds, it will beep twice. The user then presses and holds the control button (such as button selector 28) for 5 seconds and the thresholds become stored in memory (not shown) and the setup mode is exited. A successful calibration will result in the control box 20 making a series of beeps. The beeps will last 5 seconds allowing the user to back away from the control box 20 before it begins misting. Thereafter, the CPU 505 will run its normal program. A filter timer is initialized and started, and the misting system 5 will function autonomously until the filter timer reaches 0.

When it is time to change the filter cartridge (i.e., when the filter timer reaches 0), the misting system 5 is programmed to alert the user via a series of audible beeps that run for 5 seconds every other hour (only during the day). When the user is ready to make the filter 30 change, they will turn off the water source and disconnect the hose 40 from the input port 22. The control button 28 is pressed and held for 5 seconds. The control box 20 will make a series of beeps to let the user know it is now in standby mode and is OK to change the filter 30. The user removes the old filter 30 by unscrewing it from the control box 20 and replaces it with a new filter 30. Once the water source is reconnected and turned on, the user presses and holds the control button 28 for 5 seconds. The control box 20 responds by emitting a series of beeps and the main program begins to run. The filter timer is also reset.

Adjustable Manifold

The manifold 505 can be replaced by an adjustable manifold 605, as illustrated in FIGS. 6A-6C. The adjustable manifold 605 may include a manifold body (or housing) 610. The manifold body 610 may have an inside diameter that traverses the length of the manifold body 610. The manifold body 610 may include a tubing end 615 and a coupling end 620. In one or more embodiments, the tubing end 615 is integral with a tubing-end shoulder 625. In one or more embodiments, the coupling end 620 is integral with a coupling end shoulder 630.

In one or embodiments, the tubing-end shoulder 625 has an outside diameter larger than the outside diameter of the tubing-end 615. In one or more embodiments, the tubing-end shoulder 625 has an inside diameter that is larger than the inside diameter of tubing end 615. A tubing-end funnel 635 is formed by this configuration.

In one or embodiments, the coupling-end shoulder 630 has an outside diameter that is larger than the outside diameter of the coupling end 620. In one or more embodiments the coupling-end shoulder 630 has an inside diameter that is smaller than the inside diameter of the coupling end 620. A coupling-end funnel 640 is formed by this configuration.

In one or more embodiments, the adjustable manifold 605 includes a ¼" tube 645. The ¼" tube 645 has an outside diameter that is smaller than the inside diameter of the manifold body 610, which produces a water clearance 650 where water can flow between the inside diameter of the manifold body 610 and the outside diameter of the ¼" tube 645 to the spray nozzles 56. In one or more embodiments, the ¼" tube 645 has an inside diameter that traverses the length of the ¼" tube 645.

In one or more embodiments, the adjustable manifold 605 may include a tubing-end O-ring 655 and a coupling-end O-ring 660. In one or more embodiments, the tubing-end O-ring 650 may sealingly abut against the tubing-end funnel 635. In one or more embodiments, the coupling-end O-ring 660 may sealingly abut against the coupling-end funnel 640.

In one or more embodiments, the adjustable manifold 605 may include a tubing end insert bushing 665. In one or more embodiments, the tubing end insert bushing 665 has an outside diameter that is smaller than the inside diameter of the tubing-end shoulder 625. The tubing end insert bushing 665 may have outside diameter larger than the manifold body 610 inside diameter. In one or more embodiments, the tubing end insert bushing 655 has an inside diameter that traverses the length of the tubing end insert bushing 665. In one or more embodiments, the inside diameter of the tubing end insert bushing 665 is larger than the ¼" tubbing 645.

In one or more embodiments, a tubing end collet 670 is couplable to the tubing end insert bushing 655. In one or embodiments, the tubing end collet 670 has an inside diameter that is larger than the outside diameter of the ¼" tube 645. When assembled as shown in FIG. 6C, the tubing end collet 670 engages the ¼" tube 645 and secures it to the tubing end insert bushing 665 in such a way that the ¼" tube 645 can slide inside the tubing end collet 670 and the tubing end insert bushing 665. The tubing end insert bushing 665 engages with the tubing end shoulder 625 and the tubing-end O-ring 655 to seal the water clearance 650 at the tubing end 615 of the manifold body 610.

In one or more embodiments, the adjustable manifold 605 may include a coupling end insert bushing 675. In one or more embodiments, the coupling end insert bushing 675 has an outside diameter that is smaller than the inside diameter of the coupling-end shoulder 630. The coupling end insert bushing 675 may have outside diameter larger than the manifold body 610 inside diameter. In one or more embodiments, the coupling end insert bushing 675 has an inside diameter that traverses the length of the coupling end insert bushing 675. In one or embodiments, the inside diameter of the coupling end insert bushing 675 is larger than the ¼" tubing 645.

In one or more embodiments, a coupling end collet 680 is couplable to the coupling end insert bushing 675. In one or embodiments, the tubing end collet 680 has an inside diameter that is larger than the inside diameter of the ¼" tube 645. When assembled as shown in FIG. 6C, the tubing end collet 670 engages the coupling end insert bushing 675, which in turn engages with the coupling end shoulder 630 and the coupling-end O-ring 660 to seal the water clearance 650 at the coupling end 620 of the manifold body 610.

The tubing end collet 670 includes teeth 685 (the teeth for the coupling end collet 680 are not labeled to avoid cluttering FIGS. 6A, 6B, and 6C) that normally engage the ¼" tube 645. The teeth 685 allow the ¼" tube 645 to be pushed into the adjustable manifold 605 but prevent the ¼" inch tube 645 from being pulled out of the adjustable manifold 605. When the tubing end collet 670 is pressed in (i.e., toward the tubing end insert bushing 665) the teeth 685 are disengaged from the ¼" tube 645, which allows the ¼" tube to be pulled out of the adjustable manifold 605.

The adjustable manifold 605 is shipped with the ¼" tube 645 withdrawn inside the manifold body 610. At installation, the adjustable manifold is coupled to the outside of the compressor as described above and the ¼" tube is extended to mate with the filter 30 as shown in FIG. 1.

Multiple adjustable manifolds 605 can be daisy-chained together, as shown in FIG. 6D. A ¼" tube 687 from a second adjustable manifold 605 is inserted into the coupling end collet 680. As a result of this installation, the first adjustable manifold and the second adjustable manifold are pressurized by the water supply. Additional adjustable manifolds 605 can be added. In one or more embodiments, 4 adjustable manifolds 605 are provided, one for each side of the compressor.

The final adjustable manifold 605 in the chain of adjustable manifolds 605 is illustrated in FIG. 6E. It includes an air bleeding check valve 690, which is illustrated in more detail in FIG. 6F.

The air bleeding check valve 690 includes an insert sleeve 691 that has the same outside diameter as the ¼" tube 645 and an inside diameter sufficient to allow the passage of air and water. The air bleeding check valve 690 further includes a valve body 692 that is integral with the insert sleeve 691 and includes a chamber 693 with an inside diameter larger than the inside diameter of the insert sleeve 691. The air bleeding check valve 690 further includes an outlet port 694 that is integral with the valve body 692 and has an inside diameter smaller than the inside diameter of the chamber 693. The interface between the valve body 692 and the outlet port 694 forms two shoulders: an O-ring shoulder 695 and a spring shoulder 696. A check valve O-ring 697 sealingly abuts the O-ring shoulder 695. A cylindrical piston 698 is located in the chamber 693 and moves within the chamber 6933. A spring 699 abuts the cylindrical piston 697 at one end and the spring shoulder 696 at the other end.

The cylindrical piston 698 does not fill the entire inside diameter of the chamber 693. As a result, air will pass around the cylindrical piston 698 and escape through the outlet port 694. Water flowing through the air bleeding check valve 690 will escape around the cylindrical piston 698 and through the outlet port 694 until the water pressure in the chamber 693 exerted on the cylindrical piston 698 is sufficient to compress the spring 699 to the point where the cylindrical piston 698 seals against the check valve O-ring 697. At that point, the air bleeding check valve 690 acts as a plug.

As a consequence, when the solenoid valve 25 is first turned on, allowing water to flow to the adjustable manifold

605, any air present in the system will escape through the air bleeding check valve 690. When water reaches the air bleeding check valve 690, the air bleeding check valve 690 closes, causing all adjustable manifolds 605 in the chain to pressurize and spray water through their respective spray nozzles 56.

In one or more embodiments, a filter check valve similar to the air bleeding check valve 690 is installed on the output 34 of the filter 30. The difference is the filter check valve has a tee from the valve body 692 allowing water to continue into the second tubing when the cylindrical piston 698 seals on the check valve O-ring 697. This allows a short flow of water through the valve in the time that the spring 699 is being compressed by the cylindrical piston 698 so that no water that is oversaturated with filtration media can continue into the tubing and manifolds potentially causing clogs.

When the system turns misting off and there is no water pressure, water in the ¼" tubings 645 and adjustable manifolds 605 drains out of either the air bleeding check valve 690 or the filter check valve, whichever is closer to the ground.

Wireless Misting Controller

A wireless misting controller 705 is shown in FIGS. 7 and 8. The wireless misting controller 705 consists of a microprocessor based controller (or CPU 710, which may be a microprocessor as shown in FIG. 8) loaded with a programmed algorithm with adjustable variables, whose purpose is to take in various sensor inputs (electromagnetic/current (EM/I) 715, acoustic 720, temperature 725, pressure 730, current in and out (Iin/Iout) 735, wifi 740 (to receive, for example, current and/or forecast weather information) to compute the appropriate misting program and execute it to control the solenoid valve 25. The wireless misting controller 705 also tracks and stores all runtime data, incoming sensor input data as well as the results of various calculations from such data. This data is stored locally on the wireless misting controller 705 in a log 805 and is periodically transmitted via wifi link 745 to a cloud based server (described below in connection with FIGS. 9, 10 and 13) where the data is used for computing reports, making adjustments to the program variables and interacting with the customer (i.e., by providing alerts). Local program variables can be changed by the cloud based server to help the local wireless misting controller 705 learn or optimize its operation. Savings reports generated by the server side computations may be pushed to the customer via smart phone APP or web interface. A jack 810 may be included to allow use of external power and may also be used to update firmware.

Installation of the misting system 5 and the wireless misting system 705 is benign. It requires no wiring or professional plumbing to make it work, it acquires all of its telemetry data via wireless sensor interaction with the condenser unit, meaning it gathers all required telemetry by just being in the vicinity of the AC condenser. The system is delivered to the customer pre-assembled and tested. All the customer needs to do, to install a misting system 5, is to hang the control box 20 or the wireless misting controller 705 and the manifold(s) 50 and tighten a garden hose.

Electromagnetic Field/Compressor Current Detection

The control box 20 and wireless misting controller 705 have an ultra-sensitive, 3 axis magnetic field detection system that allows the onboard microprocessor to receive and measure the magnetic field being transmitted by the compressor motor and/or fan motor while running. On board circuitry can remove or filter the 50-60 hz component and deduce a proportional voltage to the current running through the compressor motor. This voltage value is then passed to the CPU's 710 on board analog to digital converter (ADC) and output to its registers in a 0-2000 count format. This count value is used to determine magnitude for turn on events as well as current calculations via lookup tables in the CPUs 710 registers.

Acoustic Level Detection

The control box 20 and wireless misting controller 705 have a sensitive microphone and associated amplification and filtering circuitry that allow it to listen for and measure the specific 50-60 hz noise created by the compressor and its fan during operation. The analog voltage level produced by this circuit is sent to the CPU's 710 ADC and output to its registers in a 0-1000 count format. This count value is used to determine magnitude to confirm a turn on event.

Temperature Input

On board temperature sensor allows the control box 20 and wireless misting controller 705 to decide when it is warm enough to run a misting program. The input from this sensor is weighed within a mist program algorithm executed by the CPU 710. Allowable temperature ranges are controlled via real time interaction with the cloud based server (discussed below).

Charge Sensing (Iin/Iout)

With the main power source being solar it is useful to keep track of the energy storage system's status as well as knowing if there is a power deficit. The CPU 710 tracks the amount of current going into the battery pack as well as the amount going out to get a an overall picture of the power system's general health. There are preprogrammed fail safes built into the system that will force the computer into a self-preservation mode, disabling all wifi communications but continuing misting operation, until battery levels can be replenished. This way all misting functionality is maintained even if the wireless link needs to be severed due to power concerns. This power in vs power used will be shown graphically to the customer via an application that runs on a mobile device or a computer ("APP"). This data can help tailor their use of the "APP".

Wifi Connectivity

Other remote devices can connect with the control box 20 or wireless misting controller 705 to either tell it to turn on/off or change various program parameters via reprogramming. The control box 20 and wireless misting controller 705 are also able to transmit reports of all stored data to cloud based servers (described below in connection with FIGS. 9, 10, and 12) for data extrapolation and the creation of reports for the customer to utilize in the provided "APP". The control box 20 and wireless misting controller 705 store all telemetry and runtime data for a 24 hour period, once this 24 hour buffer is filled with data, control box 20 and wireless misting controller 705 will make connection with a cloud based server (described below in connection with FIGS. 9, 10, and 12) and send the report, where it will be logged to that specific account and used to quantify savings, etc.

Pressure Sensor

A pressure sensor may be located at the inlet to the solenoid valve 25, which allows incoming pressure as well as functional pressure drop to be measured by the CPU 710. This sensor uses a relative type of measurement scale, meaning that the CPU 710 will decide what the normal baseline pressure reading is and send alarms should pressures fall below certain preset operational thresholds.

Alarms

In the event of freezing weather or a pressure drop in the system (due to leaks or catastrophic failure) the control box 20 and wireless misting controller 705 will send an alert signal to the cloud based servers (described below in connection with FIGS. 9, 10, and 12) which will then contact the customer via the "APP" to alert them of a possible problem. In the event of a detected downstream leak the CPU wills cease operation until action is taken.

Disable/Enable

A user is able to turn on or turn off the misting function at any time via the APP. When this selection is made our servers will contact that particular control box 20 and wireless misting controller 705 and disable/enable misting.

Valve

Due to low power requirements, the misting system 5 utilizes a low power latching type piloted solenoid valve. A small 2 mS positive going pulse opens the valve while a 2 mS negative going pulse closes the valve.

Because the valve stays in a steady state once a pulse a received no other power is used keeping it open or close. Negative and positive pulses are provided by the microprocessor and are buffered via an H bridge of mosfets.

Low Power

Because control box 20 and wireless misting controller 705 is battery/solar operated, power use is carefully monitored. Without the wifi transceiver requirements the system utilizes a few nano amps to function. Care was taken during circuit design to minimize drain currents, leakage, and IC power consumption. All systems are gated via high side mosfet and are switched on only when needed. The control box 20 and wireless misting controller 705 spends most of its time in a sleep state, waking all systems once every ~2 seconds for a period of 100 ms then returning to sleep. This topology ensures extremely low power consumption and allows the product to subsist on very low recharge rates.

Preassembly and Adjustability

All systems are assembled and pretested prior to being shipped to the customer. The customer can adjust tube length on the manifold system without compromising the factory tested seal. Adjustments are made by pushing in the locking tubing end collet 670 while pulling out the IA" tube 645 to desired length, as described above in connection with FIGS. 6A, 6B, and 6C. This is accomplished by utilizing a specially designed radial sealing/feed system in the manifold design that allows a large length of IA" tube 645 to be passed through it while retaining flow to all nozzles 56 in its path. The locking tubing end collet 670 ensures once the length is adjusted it will stay constant.

Mistbox Algorithm

INTRODUCTION

To minimize water consumption while maximizing power savings, control box 20 and wireless misting controller 705 use a number of criteria to determine when misting should occur. The process effectively trades water for energy, which can be beneficial monetarily for a homeowner. However, air-cooled air conditioning systems are only inefficient in certain cases. While misting continually would fully minimize power consumption, such operation would be very wasteful where water is concerned. Also, even misting only when the AC system is running can produce situations with extreme diminishing returns. Thus, to fully optimize the system and maximize savings, an algorithm takes into account a number of different criteria to decide when misting should take place.

Algorithm Variables

1. Whether the AC system is running Not only should the fan be running, but the system should be in a cooling cycle or else cooling the intake air will have no benefit. To accomplish determining whether the condenser unit is running or not, the control box 20 and wireless misting controller 705 measure the following metrics.

A. Electromagnetic field strength to indicate whether the compressor motor is running;

B. Vibration to determine whether the fan is in operation; and

C. Acoustic (sound) to determine whether the fan and motor are running.

Sensing all of these criteria and having redundancy built in helps to avoid false triggers. Unique thresholds are set by the control box 20 or the wireless misting controller 705 for each of the three stimuli. Because the control box 20 and the wireless misting controller 705 can be mounted anywhere on the unit housing, the control box 20 and the wireless misting controller 705 sense the conditions that are present during operation, and then appropriately sets these thresholds for future determination of whether the AC system is active.

2. What the current air temperature/humidity environment is surrounding the AC unit. Through testing, it has been determined a good rule of thumb is that the minimum temperature threshold for mist operation is about 75 degrees F. This minimum threshold is flexible, depending on the relative humidity at any given time.

3. How efficient that particular AC system is. Some AC systems are old and inefficient and some are brand new and efficient. To optimally determine when the control box 20 or the wireless misting controller 705 should run, the control box 20 or the wireless misting controller 705 performs periodic testing to determine how well the AC system is cooling the home without the aid of the control box 20 or the wireless misting controller 705. Then, it compares operation with misting present to determine how much the control box 20 or the wireless misting controller 705 is increasing efficiency . . . if at all. These tests are done until each temperature/humidity situation has been accounted for.

Temperature/Humidity Situational Analysis

If the assumption is made that evaporative pre-cooling should not take place when temperature is below 75 degrees F., then it is useful to analyze each degree above 75 degrees F. to determine if misting should occur. Setting aside the factor of AC system efficiency for a moment, the only other variable of importance other than temperature when determining optimal misting patterns is humidity. Since evaporative cooling is the method the control box 20 or the wireless misting controller 705 uses to cool the intake air, it follows that evaporation (and thus evaporative pre-cooling) with more easily occur when the relative humidity is low. However, even though complete evaporation of the water is optimal, there is still benefit during the misting process when unevaporated water hits the hot condenser fins. This also facilitates increased efficiency, though not to the same extent as the fine mist evaporating in the air. Thus, there are situations where misting could be the correct financial decision even when the humidity level is very high, if the temperature is sufficiently high as well.

The algorithm will be continually adapted as more and more qualitative testing data is accumulated from control boxes 20 or the wireless misting controllers 705 all over the world. The temperature scenarios will set up from 75 deg to 105 deg F., and the humidity levels will be set up from 0% to 100% in 5% increments. This implies a total of 651 temperature/humidity scenarios assuming these preset ranges and 5% humidity increment rounding. It will be understood that additional scenarios are also possible.

While it would take many, many tests at each individual control box 20 or wireless misting controller 705 to determine optimal operation by gathering data at each of the 651 temperature/humidity scenario combinations, by gathering the data across all units that are installed worldwide it will be possible to obtain data at each scenario rather quickly. Then, this "crowdsourcing" of data can be harnessed to update onboard thresholds for misting optimization for all customers. Current humidity and temperature information for each location is pulled from weather application program interfaces (API), and is then combined with the temperature reading by the control box 20 or the wireless misting controller 705 at the location. It will be understood that a humidity sensor could be added to the control box 20 or the wireless misting controller 705.

AC Unit Efficiency Analysis

The other variable that is accounted for is the efficiency of the AC system. By tracking the run-time length of a cycle, the control box 20 or the wireless misting controller 705 can determine how much workload is needed to cool the home without the control box 20 or the wireless misting controller 705. Then, during another cycle at the same temperature/humidity combination, the control box 20 or the wireless misting controller 705 can measure how much more efficient the system is when mist is operating. These operation metrics of the AC system can be compared to many other AC systems to determine a relative efficiency value compared to other, known systems. By categorizing AC systems together in groups as a function of their efficiency in certain temperature/humidity situations, data from testing can be applied more rapidly. For example, each AC system can be given a rating on a 1-10 scale to indicate how efficiently it runs. Then, this factor can be added to the decision making process.

Make/Model Information Inputs

Customers are asked to provide the make, model, and size (British Thermal Units (BTUs) or tonnage) of their AC unit when they create an account. By collecting this information, the cloud based servers (discussed below in connection with FIGS. 9, 10, and 12) will be able to immediately apply any data from other customers with the same model unit. This will reduce the need for as testing a specific AC unit to determine efficiency.

Power and Water Cost Inputs

Because there can be large discrepancies in prices customers pay for water consumption and power usage, these variables must be taken into account when deciding how to perfectly optimize misting operation for each individual customer. Customers enter their price in dollars per kilowatt-hour ($/kwh) for power as well as their price in dollars/gallon for water. Other units for power and water can be used as well in other countries as needed. Some areas also have variable pricing depending on factors like total monthly consumption or peak demand usage. These variables can dramatically alter the cost benefit landscape and are be accounted for. Customers will be able to enter in the peak hours that their power supplier charges more for power, and the control box 20 or the wireless misting controller 705 will take that information into account when determining whether mist should be applied for given AC cycles. Decision making flow on misting operation. Must have "YES" answer for all to mist:

In one or more embodiments, all of the following questions must be answered in the affirmative in order to enable misting (note that not all of these conditions need to be met in other embodiments):

Is enough EMF detected to determine AC unit may be running?

Is enough acoustic stimuli present to determine AC unit may be running?

Is enough vibration sensed to determine AC unit may be running?

Is temperature high enough to warrant checking temp/humidity conditions table?

Is temp/humidity combination an acceptable condition for misting to occur in an average situation based on information aggregated from crowd sourced data?

Does AC unit efficiency (from testing or from make/model info) dictate that misting would be profitable at this temp/humidity?

Cost Saving Potential Analysis of Each Situation:

Power is saved in two ways with the control box 20 or the wireless misting controller 705. First, the control box 20 or the wireless misting controller 705 allows the AC unit to cool the home faster, meaning the AC unit runs less. Power savings are realized through simply less power consumed to run the AC unit. Second, because of the increased efficiency of the AC unit, it actually uses less power while it's running as well. So savings for any period of time can be quantified with the equation:

$$SAVINGS=[Power\$current]\times[(RedRT)\times(KWH/secN)+(TotRT)\times(KWH/secN-KWH/secR)]-(RedRT\times FlowR\times Water\$)$$

Where:

T/H=current temperature/humidity combination conditions,

FlowR=flow rate of water when the control box 20 or the wireless misting controller 705 is running in gallons/sec Water$=water cost in $/gallon Power$current=current power cost in $/KHW (could vary during peak usage times)

RedRT=Reduced run time (in seconds) due to the control box 20 or the wireless misting controller 705 misting operation KWH/secN=KWH consumed per second without the control box 20 or the wireless misting controller 705 for T/H TotRT=Total unit run time (in seconds) where the control box 20 or the wireless misting controller 705 is operating KWH/secR=KWH consumed per second with the control box 20 or the wireless misting controller 705 for T/H Conclusion The control box 20 or the wireless misting controller 705 algorithm for optimizing misting operation inspects a number of different variables and performs cost saving analysis on each specific weather scenario based on a customer's water and power pricing, and the efficiency of their AC system. This will allow the control box 20 or the wireless misting controller 705 to fully maximize potential savings for each customer on an individual basis.

Cloud Based Server

In one or more embodiments, illustrated in FIG. 9, the wireless misting controller 705 interfaces through, for example, a wireless access point 905 with a cloud based server 910. While only one cloud based server 910 is shown, it will be understood that a plurality of such servers may be used and that they may be located in a central location or they may be distributed geographically. In one or more embodiments, the cloud based server 910 communicates with a mobile device 915 (or a personal computer, tablet, or other computing device), to receive commands and information from the mobile device 915 and to provide status and reports to the mobile device 915. The wireless misting controller 705 operates to improve the efficiency of compressor 920.

In one or more embodiments, the communications among the wireless misting controller 705, the wireless access point 905, the cloud based server 910, and the mobile device 915 are by way of a network 925. In one or more embodiments, the network 925 includes a wide area network (WAN)(such as the Internet), a personal area network (PAN), a local area network (LAN), a metropolitan area network (MAN), a virtual private network (VPN), and/or a wired network.

Figure 10:
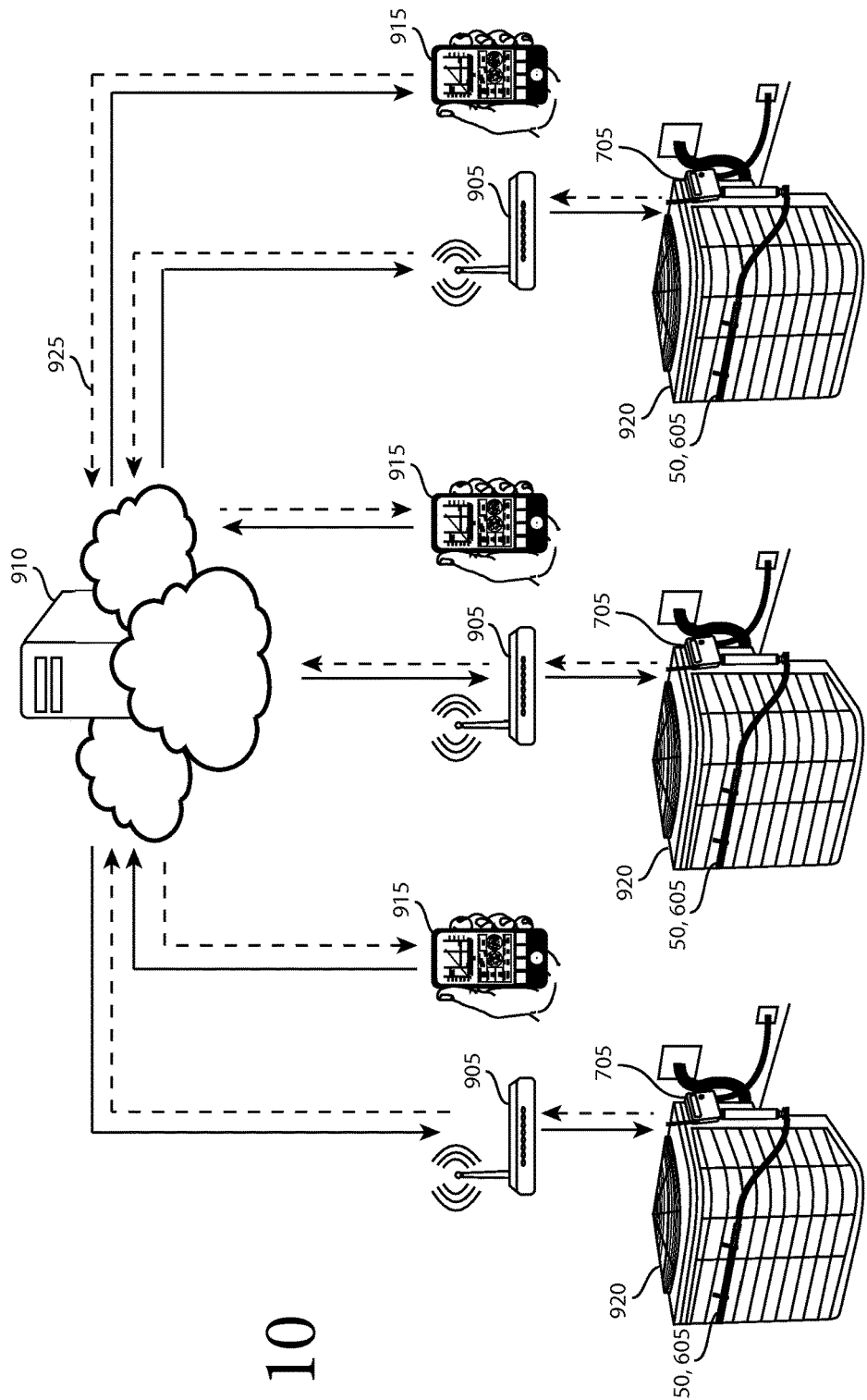
FIG. 10 is a block diagram of multiple misting systems interacting with a cloud based server.

In one or more embodiments, illustrated in FIG. 10, the cloud based server 910 communicates with a plurality of wireless misting controllers 705 via the network 925. The dashed lines and solid lines in FIG. 10 indicate the possibility of independent communications. For example, the dashed lines and solid lines between the wireless misting controllers 705 and the wireless access point 905 do not merely refer to handshaking that typically occurs in wireless networks, but indicates the transmission of commands and/or data to and from cloud based server 910.

The cloud base server 910 may take data from one wireless misting controller 705 and use that data to control operations in another remote wireless misting controller 705, as described above. The cloud base server 910 may analyze data from one wireless misting controller 705, and as a result of the analysis, provide another wireless misting controller 705 with updates to its programming, thresholds, or other data. Having multiple wireless misting controllers 705 communicate with the cloud based server 910 allows the cloud based server 910 to analyze, configure, monitor, measure, activate and/or deactivate a wireless misting controller 705 remotely based on desired parameters.

In one or more embodiments, a customer (not shown) may control the settings, configure the program, and/or install updates to the wireless misting controller 705 via a mobile APP. The customer may also remotely access a wireless misting controller 705 via a computer that has access to the network 925.

Evaporative Cooling Boxes
Problem:

To precool an AC condenser one must broadcast a water mist around the condenser allowing the mist to interact with the air, before being drawn into the condenser's heat exchanger, to evaporate and effectively drop the temperature of the air going through the condenser thusly increasing the cooling systems efficiency. Drawbacks of this method include the amount of water that must be consumed in the process as well as the impact that said water has on its surroundings. Excessive contact with ground water can cause metal parts to corrode as well as leave mineral deposits on critical surfaces impeding their function.

Solution

Self-contained and controlled evaporative cooling modules allow air and water to interact within a specially designed, controlled environment, minimizing water consumption and water associated impact on nearby surfaces (scale, rust, etc).

Operation:

With the cooling box, the water to air evaporation is kept inside a controlled environment, completely removed from the condenser unit. The design is such that no water will be allowed to leave the proximity of the box, doing away with all possible water contact with the condenser. Due to the wick type element design, very little water is used to achieve a desirable cooling result. Wicks are wetted by the control box 20 or the wireless misting controller via a valve when needed and are then allowed to dry via evaporation. Their vertical orientation ensures gravity will aid in water dispersion on the material.

Figure 11:
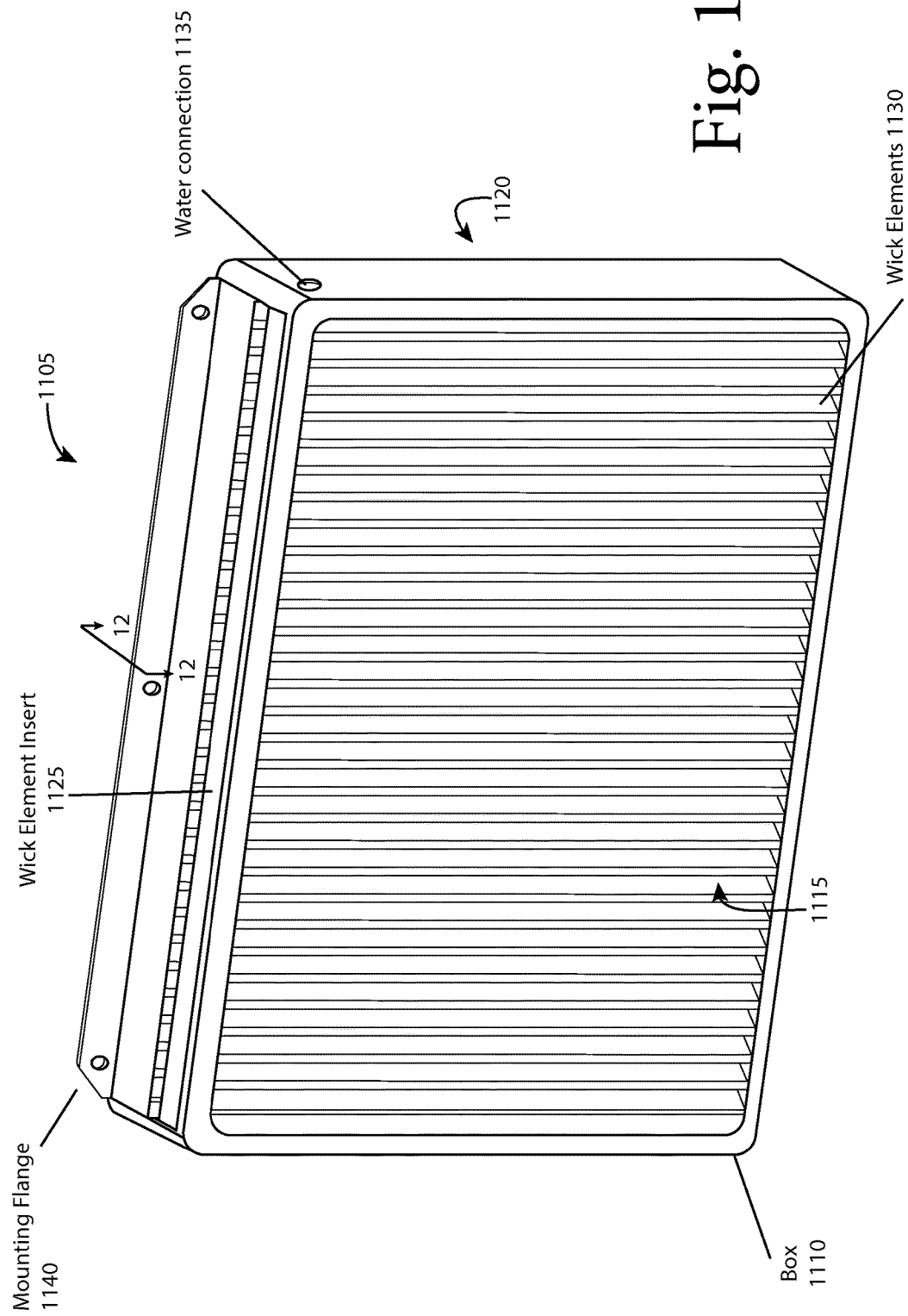
FIG. 11 is a perspective view of a box

Construction:

Cooling box modules 1105, illustrated in FIG. 11, consist of a shallow, hollow, box type housing (or box) 1110, with cut outs on the front and rear faces 1115, 1120 to allow a large amount of air to pass through. Very small mesh (400 mesh size, ~0.013" opening) stainless steel screens (not shown so other features can be seen) are spanned across these openings to prevent debris from entering the box and large water droplets from leaving the apparatus. Located in the middle of the box is a removable framed wick element insert 1125 that houses the water feed channels, which can be fed by one or more manifolds 50 or adjustable manifolds 605, and the wick elements 1130. The wick elements 1130 are made of a special super absorptive material, namely PVA fabric (poly vinyl acetate), that is treated with a compound that promotes and induces water evaporation from its surfaces (silica). The wick elements 1130 are aligned in vertical strips to maximize surface contact with the incoming air and cause minimal parasitic drag to the condenser system.

Implementation:

The boxes 1110 are placed around the condenser unit, secured by a mounting flange 1140, so that when the condenser fan turns on, it draws air from the outside through the boxes 1110 and then through the condenser itself. Upon condenser turn on detection, the control box 20 or the wireless misting controller 705 will qualify it for precooling assist by determining that the condenser is indeed running via on board sensors and using these sensors to answer operational questions such as: Is it warm enough? What is the relative humidity? How long should the wicks be actively wetted based on this information? When will the wicks need to be rewetted? Once the cycle is qualified by the controller a valve, such as solenoid valve 25, opens that allows water to flow into the box plumbing system through a water connection 1135 (or through one or more manifolds 50 or adjustable manifolds 605) thereby wetting the wick elements 1130. This water will flow for a predetermined amount of time based on local relative humidity as well as local temperature readings so that the optimal amount of water is used to wet the elements. As the air, being pulled by the condenser fan, travels through the box 1110, it passes the wetted wick elements 1130 that readily allow the water to evaporate from their surfaces, thusly cooling the air as it passes through them.

Figure 12:
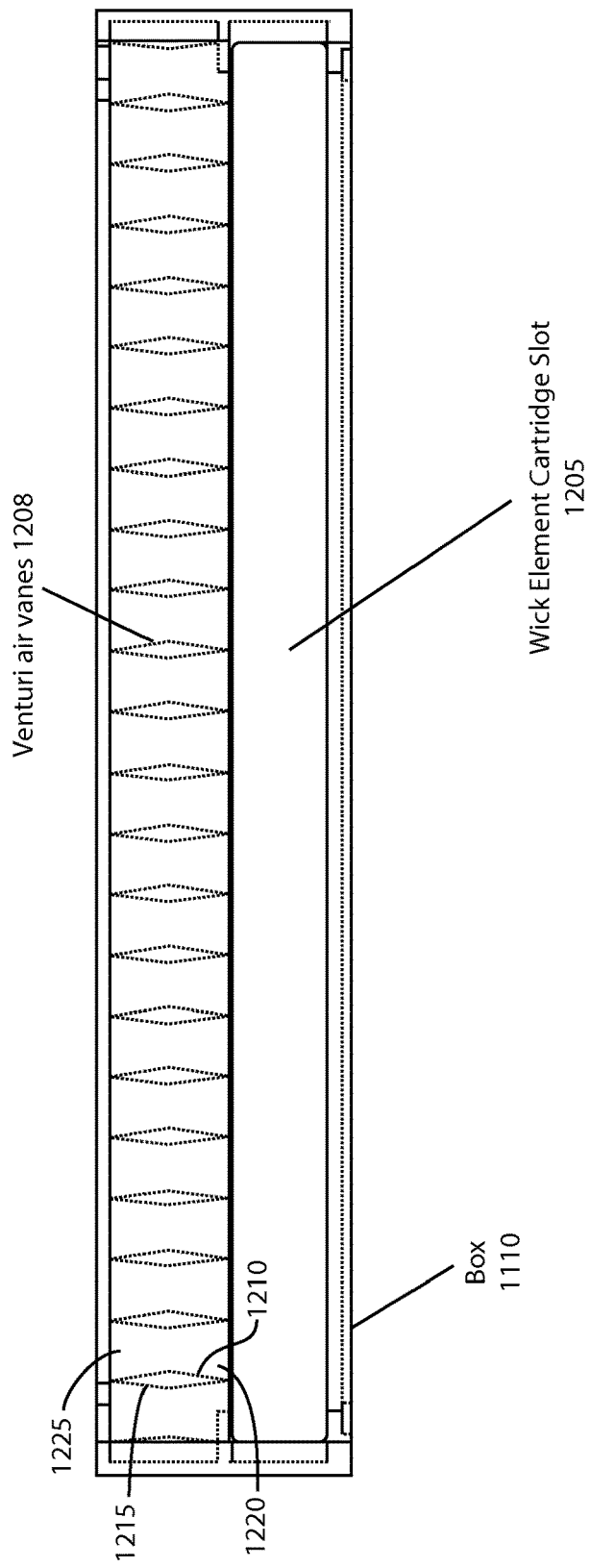
FIG. 12 is a cross-sectional view of the box of FIG. 11.

In one or more embodiments, venturi air vanes 1208, illustrated in FIG. 12, located behind the wick elements 1130, create enough turbulence and pressure drop to aid evaporation and large droplet flocculation. In one or more embodiments, the venturi shapes are created by two parallel air foils 1210, 1215, shown in FIG. 12, with a triangular profile and air gap in between. As the air stream enters the initial part of the venturi 1220, it slows down and pressure builds. As the airstream leaves the initial part of the venturi 1120, it reaches a dilution zone 1225 where pressure rapidly drops and air speed rapidly increases. These flow and pressure gradients help water evaporate initially, followed by latter particulate removal via flocculation. In one or more embodiments, the venturi air vanes 1208 are strips without the triangular shape. When the air leaves the box 1110 it is now cooler and free of liquid water or debris. The cooler air can now be drawn through the condenser's heat exchanger fins to cool hot refrigerant and dramatically increase the system's efficiency. In one or more embodiments, the cooling box module 1105 does not include the venturi air vanes 1208.

Figure 13:
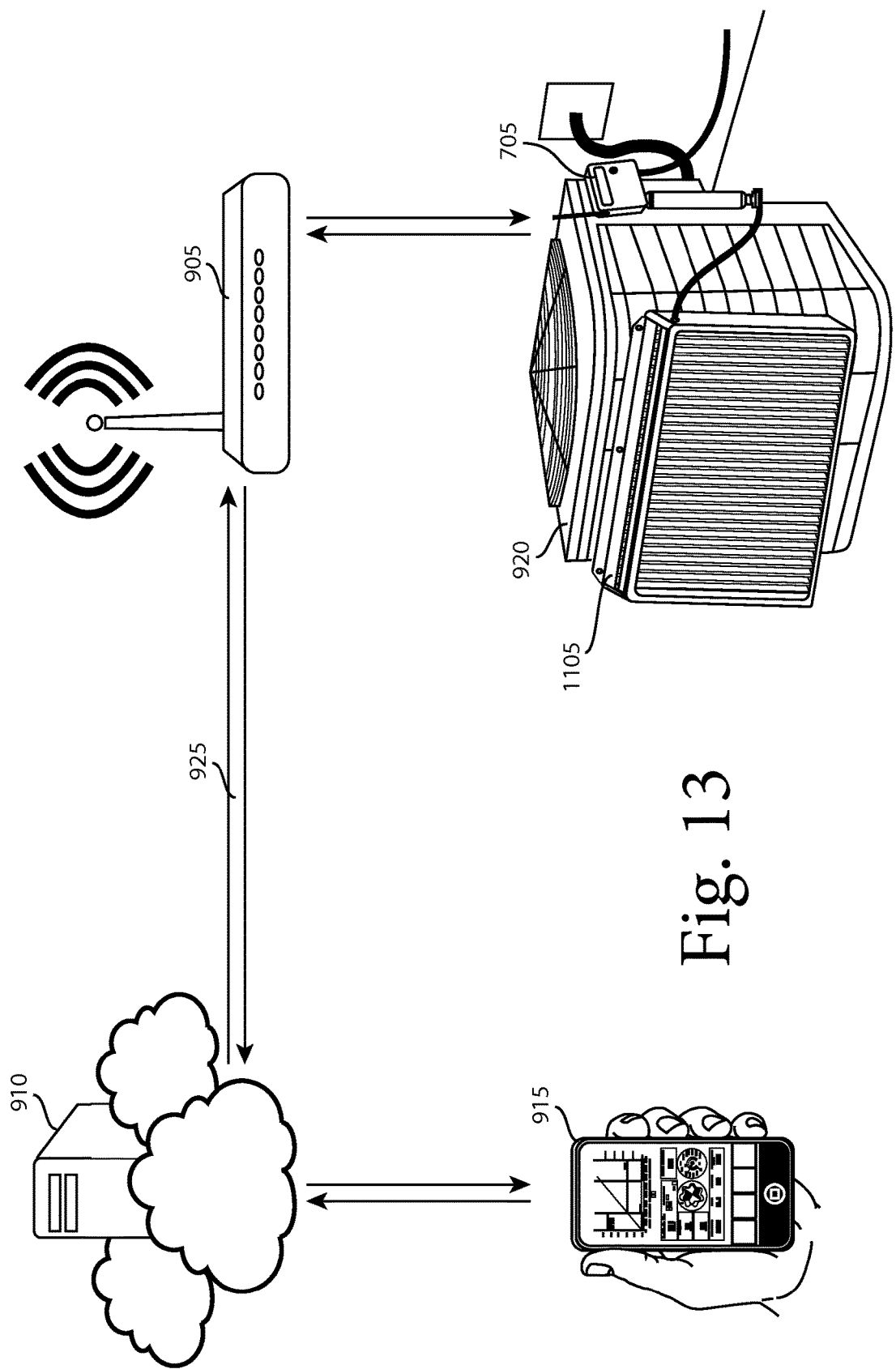
FIG. 13 is a block diagram of the misting system with a box interacting with a cloud based server.

Cloud Based Server with Cooling Box Module:

In one or more embodiments, illustrated in FIG. 13, the manifold 50 or adjustable manifold 605 shown in the arrangement of FIG. 9 is replaced by a cooling box module 1105.

Figure 14:
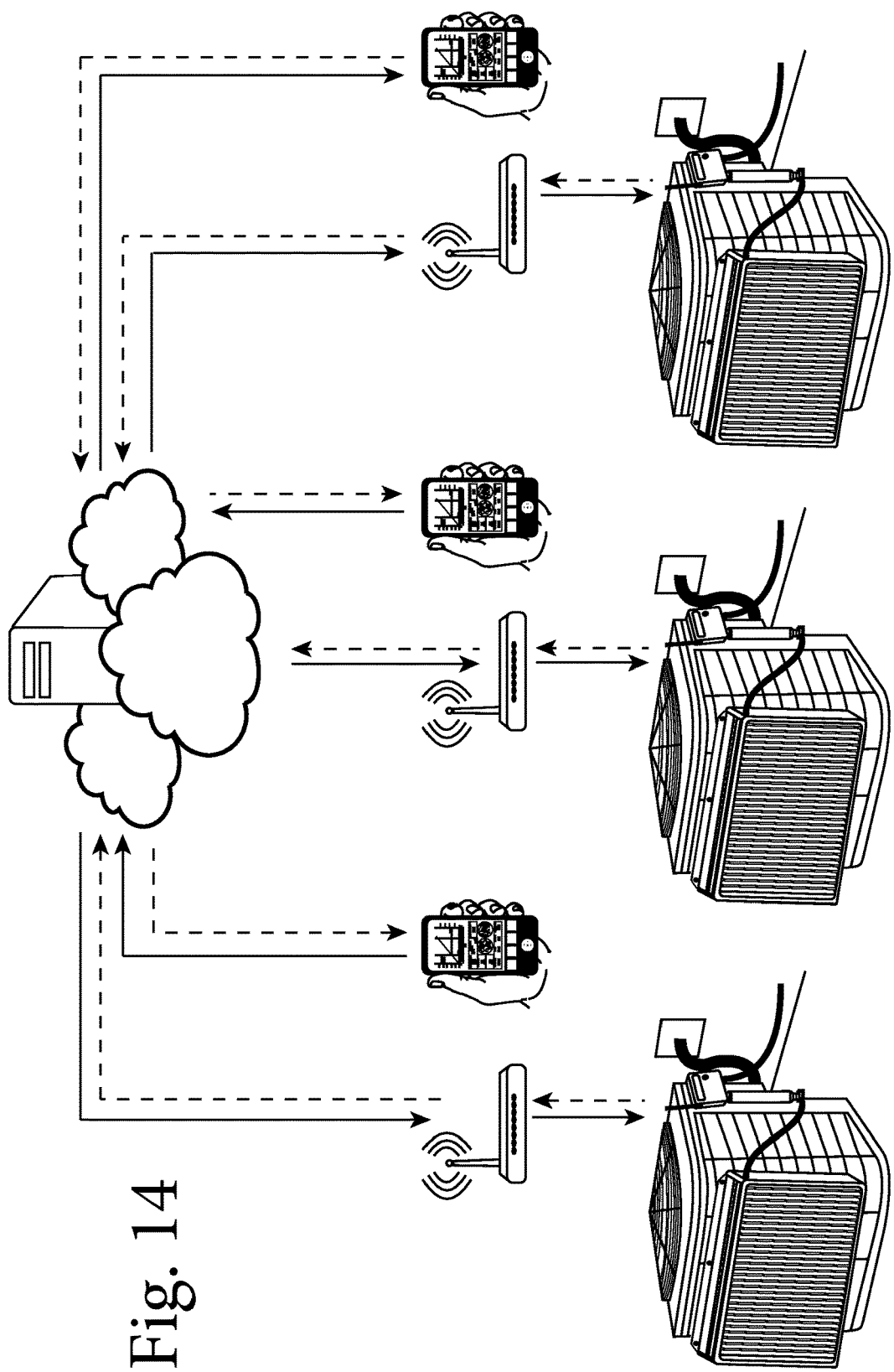
FIG. 14 is block diagram of multiple misting systems with boxes interacting with a cloud based server.

In one or more embodiments, illustrated in FIG. 14, the manifolds 50 or adjustable manifolds 605 shown in the arrangement of FIG. 10 are replaced by a cooling box modules 1105.

Additional Metrics:

In one or more embodiments, the following metrics, in addition to or in replacement of those described above, can be used to determine whether to mist:

Thermostat Wirelessly Connected to Control Box

The control box 20 or the wireless misting controller 705 may determine whether to mist based on whether a thermostat wirelessly informs the control box 20 or the wireless misting controller 705 that the compressor is running.

Additional Temperature Metrics:

The control box 20 or the wireless misting controller 705 may determine not to mist if the temperature is below a settable temperature threshold.

The control box 20 or the wireless misting controller 705 may determine not to mist if ambient temperature is above (or below) a temperature threshold and the rate of change of temperature is above (or below) a rate of temperature change threshold.

The control box 20 or the wireless misting controller 705 may determine to mist if temperature is rising at a threshold rate and the temperature is above a threshold.

The control box 20 or the wireless misting controller 705 may determine not to mist if the temperature is falling at a threshold rate and the temperature is below a threshold.

Additional Acoustic Metric

A noise maker (such as a simple horn) is attached to the grill above the compressor fan. The noise maker makes a noise when the fan is on. The control box 20 or the wireless misting controller 705 may determine to mist upon detection of the low noise.

Additional EMF Metric:

The control box 20 or the wireless misting controller 705 may determine to mist if measured counter electromotive force (CEMF) is above a threshold.

A current measuring device is coupled to the power feed for the compressor. The control box 20 or the wireless misting controller 705 may determine to mist if the current measured by the current measuring device is above a threshold.

Optical Metrics:

A mirror is placed on one of the blades of the compressor fan and a led/detector is placed outside the compressor. The led/detector receives a flash every time the blade with the mirror passes. The control box 20 or the wireless misting controller 705 may determine to mist when the frequency of pulses exceeds a threshold.

Another optical metric relies on the difference in light intensity seen by a light detector positioned to detect light coming up through the top of the compressor. The control box 20 or the wireless misting controller 705 may determine to mist based on the contrast between the intensity of the light when the fan is on and the intensity of the light when the fan is off.

Another optical metric relies on the difference in light intensity seen by a light detector positioned to detect light coming up through the top of the compressor. The control box 20 or the wireless misting controller 705 may determine to mist based on a count of flashes caused by the difference between the intensity of the light when a fan blade is below the light detector and when there is no fan blade below the light detector.

Another optical metric relies on the difference in color seen by a light detector positioned to detect light coming up through the top of the compressor. The control box 20 or the wireless misting controller 705 may determine to mist based on the contrast between the color of the light when the fan is on and the color of the light when the fan is off.

Another optical metric passes a light from one side of the fan to the other (the light should enters and leaves the area above the fan at an angle to that when the air is compressed there is refraction causing the amount of received light to diminish) and detect the change in the received light caused by diffraction resulting from the compressed air from the fan Another optical metric detects vibration in the compressor by detecting a difference in flight time from a light source to a surface on the compressor to a light detector.

Mechanical Metrics:

A generator (such as a fan) is placed at the top of the compressor. Movement of the air through the generator will generate electricity which can be detected. The control box 20 or the wireless misting controller 705 may determine to mist when the amplitude of the generated electricity reaches a threshold.

The compressor fan will move up or down slightly because of the lift caused by the fan blades when it turns on or off. The control box 20 or the wireless misting controller 705 may determine to mist upon detecting (using, for example, flight time measurements to and from an acoustic detector or a microwave detector, or the like, to the fan) the slight movement as an indication that the fan is on.

The inertia of the compressor will cause it twist on its base to counter the rotation of the compressor shaft when it first turns on. The control box 20 or the wireless misting controller 705 may determine to mist upon detecting the twist through a mechanical sensor on the compressor mount or through an optical sensor that can detect the motion of the compressor.

Combination:

The control box 20 or the wireless misting controller 705 may determine to mist based a combination of the metrics described above, where the metrics or the metric thresholds are chosen based on the values of some of the metrics; e.g., for low temperatures use one set of metrics and for high temperatures use another set of metrics.

It will be apparent to one of skill in the art that described herein is a novel apparatus and method for increasing the efficiency of an air conditioning unit. While the invention has been described with references to specific preferred and exemplary embodiments, it is not limited to these embodiments. The invention may be modified or varied in many ways and such modifications and variations as would be obvious to one of skill in the art are within the scope and spirit of the invention and are included within the scope of the following claims.

What is claimed is:

1. A system comprising:
 a misting sub-system for cooling an air conditioner at a location to affect the run time of the air conditioner;
 a cloud-based server wirelessly coupled to the misting sub-system;

wherein the cloud-based server is configured to:
  receive reports from the misting sub-system regarding environmental conditions at the location and the run time of the air conditioner;
  prepare analyses of the reports to identify monetary savings produced by the misting sub-system; and
  provide the analyses to a user.

2. The system of claim 1 further comprising:
a plurality of additional misting sub-systems for cooling a respective plurality of air conditioners to affect the run time of respective air conditioners, where the plurality of air conditioners are at a plurality of respective locations;
the plurality of additional misting sub-systems being wirelessly coupled to the cloud-based server;
wherein the cloud-based server is further configured to:
  receive reports from the plurality of additional misting sub-systems regarding environmental conditions at the respective locations and the run time of the plurality of air conditioners;
  prepare analyses of the reports to identify settings for the misting sub-system; and
  set the misting sub-system per the identified settings.

3. The system of claim 2 wherein:
the reports from the plurality of additional misting sub-systems include the current cost of power and the current cost of water at the respective locations of the respective additional misting sub-systems; and
the analyses of the reports from the plurality of additional misting sub-systems includes an analysis of a trade-off between the consumption of power and the consumption of water.

4. The system of claim 1 wherein the analyses of the reports describe the efficiency of the air conditioner.

5. The system of claim 1 wherein the analyses take into account make and model information regarding the air conditioner.

6. The system of claim 1 wherein:
the cloud-based server comprises a plurality of cloud-based servers.

7. A method performed by a cloud-based server comprising:
  receiving reports from a misting sub-system regarding environmental conditions at a location and a run time of an air conditioner at the location;
  preparing analyses of the reports to identify monetary savings produced by the misting sub-system; and
  providing the analyses to a user;
  wherein the misting sub-system is for cooling the air conditioner at the location to affect the run time of the air conditioner; and
  wherein the cloud-based server is wirelessly coupled to the misting sub-system.

8. The method of claim 7 further comprising:
receiving reports from a plurality of additional misting sub-systems regarding environmental conditions at a plurality of respective locations and the run time of the plurality of air conditioners at the plurality of respective locations;
preparing analyses of the reports to identify settings for the misting sub-system; and
setting the misting sub-system per the identified settings;
wherein the plurality of additional misting sub-systems is for cooling the respective plurality of air conditioners to affect the run time of the respective air conditioners; and
wherein the plurality of additional misting sub-systems are wirelessly coupled to the cloud-based server.

9. The method of claim 8 wherein:
the reports from the plurality of additional misting sub-systems include the current cost of power and the current cost of water at the respective locations of the respective additional misting sub-systems; and
the analyses of the reports from the plurality of additional misting sub-systems include an analysis of a trade-off between the consumption of power and the consumption of water.

10. The method of claim 7 wherein the analyses of the reports describe the efficiency of the air conditioner.

11. The method of claim 7 wherein the analyses take into account make and model information regarding the air conditioner.

12. The method of claim 7 wherein:
the cloud-based server comprises a plurality of cloud-based servers.

* * * * *

UNITED STATES PATENT AND TRADEMARK OFFICE
CERTIFICATE OF CORRECTION

| | |
|---|---|
| PATENT NO. | : 10,251,316 B1 |
| APPLICATION NO. | : 14/851146 |
| DATED | : April 2, 2019 |
| INVENTOR(S) | : William S. Nachefski et al. |

It is certified that error appears in the above-identified patent and that said Letters Patent is hereby corrected as shown below:

On the Title Page

Item (63), "which is a continuation of application No. 13/482,815" corrected to be "which is a continuation-in-part of application No. 13/482,815".

Signed and Sealed this
Ninth Day of July, 2019

Andrei Iancu
*Director of the United States Patent and Trademark Office*